United States Patent
Takahashi

(10) Patent No.: US 6,737,212 B1
(45) Date of Patent: May 18, 2004

(54) PHOTOSENSITIVE COMPOSITION

(75) Inventor: Shuichi Takahashi, Shizuoka (JP)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/857,553

(22) PCT Filed: Oct. 4, 2000

(86) PCT No.: PCT/JP00/06903

§ 371 (c)(1),
(2), (4) Date: Jun. 5, 2001

(87) PCT Pub. No.: WO01/25853

PCT Pub. Date: Apr. 12, 2001

(30) Foreign Application Priority Data

| Oct. 7, 1999 | (JP) | 11-286418 |
| Nov. 24, 1999 | (JP) | 11-333048 |
| Dec. 21, 1999 | (JP) | 11-362994 |
| Dec. 24, 1999 | (JP) | 11-367237 |
| Feb. 23, 2000 | (JP) | 2000-045430 |
| Feb. 24, 2000 | (JP) | 2000-047391 |
| Jul. 4, 2000 | (JP) | 2000-201837 |
| Aug. 25, 2000 | (JP) | 2000-255215 |

(51) Int. Cl.$^7$ ............................... G03F 7/023
(52) U.S. Cl. .................. 430/191; 430/192; 430/193; 430/270.1
(58) Field of Search .................... 430/270.1, 191, 430/192, 193

(56) References Cited

U.S. PATENT DOCUMENTS

| 3,666,473 A | | 5/1972 | Colom et al. |
| 4,115,128 A | | 9/1978 | Kita |
| 4,812,551 A | | 3/1989 | Oi et al. |
| 5,541,036 A | | 7/1996 | Igawa et al. |
| 5,601,961 A | | 2/1997 | Nakayama et al. |
| 5,620,828 A | | 4/1997 | Tan et al. |
| 5,738,972 A | * | 4/1998 | Padmanaban et al. ...... 430/170 |
| 5,942,369 A | | 8/1999 | Ota et al. |
| 5,981,135 A | * | 11/1999 | Koes et al. ............. 430/165 |
| 6,492,093 B2 | * | 12/2002 | Gaschler et al. ......... 430/271.1 |

FOREIGN PATENT DOCUMENTS

| EP | 0 421 388 | 4/1991 |
| EP | 0 766 140 | 4/1997 |
| EP | 0 851 297 | 7/1998 |
| EP | 0 851 298 | 7/1998 |
| GB | 1 440 244 | 6/1976 |
| GB | 2 172 117 | 9/1986 |
| JP | 3-119015 | 5/1991 |

OTHER PUBLICATIONS

PCT Search Report for Application No. PCT/JP00/06903, mail date Jan. 16, 2001.
English Abstract for JP 47008656.
English Abstract for JP 55073045, Jun. 2, 1980.
English Abstract for JP 55129341, Oct. 7, 1980.
English Abstract for JP 60097347, May 31, 1985.
English Abstract for JP 60140235, Jul. 25, 1985.
English Abstract for JP 60189739, Sep. 27, 1985.
English Abstract for JP 62151845, Jul. 6, 1987.
English Abstract for JP 3119015, May 21, 1991.
English Abstract for JP 4122939, Apr. 23, 1992.
English Abstract for JP 5249319, Sep. 28, 1993.
English Abstract for JP 6186560, Jul. 8, 1994.
English Abstract for JP 7169311, Jul. 4, 1995.
English Abstract for JP 8082926, Mar. 16, 1996.
English Abstract for JP 8255983, Oct. 1, 1996.

* cited by examiner

Primary Examiner—John S. Chu
(74) Attorney, Agent, or Firm—Alan P. Kass

(57) ABSTRACT

A radiation sensitive composition useful as a photoresist containing a resin composition and a radiation sensitive material, wherein the resin composition comprises a mixture of two or more resins different from each other by at least 0.03 in refractive index or comprises a resin component of an alkali-soluble resin and a resin additive of a resin working as a dissolution inhibitor for the radiation sensitive composition, such as an acrylic polymer, a methacrylic polymer or a styrenic polymer. A dissolution rate in a 2.38 weight-% aqueous tetramethylammonium hydroxide solution of the radiation sensitive composition is preferably 5000 Å/min or less. Use of these resin compositions enable one to reduce the amount of the quinonediazide radiation sensitive agents to be used and obtain a radiation sensitive composition which has both high sensitivity and highly normalized film remaining characteristics.

23 Claims, 2 Drawing Sheets

NOVOLAK RESIN : ACRYLIC POLYMER = 100 : 10 (RESIN FILM)

PHOTOSENSITIVE COMPOSITION

TECHNICAL FIELD

This invention relates to a radiation sensitive composition comprising a resin composition and a radiation sensitive material and, more particularly, to a radiation sensitive composition suitably usable as a photoresist material in manufacturing a semiconductor device such as LSI and a flat panel display such as a liquid crystal display (LCD) etc., and like use.

BACKGROUND ART

In the wide field of manufacturing semiconductor integrated circuits such as LSI, producing FPD, manufacturing a circuit substrate for thermal head etc., and like use, photolithography technique has so far been employed for forming microelements or conducting fine processing. In the photolithography technique, a positive or negative-working radiation sensitive composition comprising a resin component and a radiation sensitive material is used for forming a resist pattern. Of these radiation sensitive compositions, those compositions comprising an alkali-soluble resin and a radiation sensitive material of quinonediazide compound are popularly used as the positive-working radiation sensitive compositions. As such compositions, there are described compositions having different formulations as, for example, 'novolak resin/quinonediazide compound' in many documents such as Japanese Examined Patent Publication No. S54-23570 (U.S. Pat. No. 3,666,473), Japanese Examined Patent Publication No.56-30850 (U.S. Pat. No. 4,115,128), Japanese Unexamined Patent Publication Nos. S55-73045 and S61-205933, etc.

These compositions comprising a novolak resin and a quinonediazide compound have so far been studied and developed with respect to both novolak resins and radiation sensitive materials. In respect of novolak resins, there have been developed novel resins. In addition, radiation sensitive compositions having excellent properties have also been obtained by improving properties of conventionally known resins. For example, there are disclosed techniques providing a radiation sensitive composition having excellent properties by using a novolak resin with a particular molecular weight distribution in Japanese Unexamined Patent Publication Nos. S60-140235 and H01-105243 and by using a novolak resin from which low-molecular-weight components of the resin has been removed by fractionation in Japanese Unexamined Patent Publication Nos. S60-97347, S60-189739 and Japanese Patent Publication No. 2590342. Further, as the negative-working radiation sensitive composition, a composition comprising a novolak resin, an alkoxymethylated melamine as a cross-linking agent and a halogenated triazine as an acid generator (Japanese Unexamined Patent Publication No. H5-303196) can be mentioned. Up to now, radiation sensitive compositions having various compositions have been developed, and as a result of the improvement of the characteristics of these radiation sensitive compositions, a large number of radiation sensitive compositions have been put into practice.

On the other hand, degree of integration in semiconductor elements have been increased year by year and, in the manufacture of semiconductor elements or the like, processing of patterns with a line width of less than sub-micron order has become required. However, conventionally known radiation sensitive compositions can not satisfy enough these requirements in the prior art described above. Further, the large-sizing of the mother glass is advancing in the production of display surface of LCD etc. When the conventional radiation sensitive composition is used as the resist material, there arise the following problems with large-sizing of a mother glass:

That is, first, there is mentioned the problem of sensitivity of the resist as large-sizing of the mother glass. This is because the frequency of pattern exposure by the exposure device is increased as the substrate is large-sized and when the conventional radiation sensitive composition is used, the throughput (yield per unit time) in production is lowered. For improvement of the throughput, the higher sensitization of the resist is required.

In order to meet the higher sensitization of a resist composition, methods have been taken such as use of a low-molecular weight resin, decreasing of the amount of a radiation sensitive material to be added, addition of a material having high dissolution rate in an alkali solution, and use of a radiation sensitive material having high sensitivity. Of these methods, however, by using a low-molecular-weight resin or decreasing of the amount of a radiation sensitive material to be added, there arise some problems. That is, though the coating properties of the resist composition and the line-width uniformity of the resist patterns can be improved, the heat resistance of the resist obtained lowers. As the result, the etching resistance of the resist drops in the production of semiconductor devices and the like. Further, the developability of the resist composition becomes so poor that scum (residue in development) is formed and the film retention rate drops. For example, when the amount of the radiation sensitive material is less than conventional, for example 20 parts by weight or less relative to 100 parts by weight of the resin, the film retention properties of the resist composition containing only novolak resin as the resin component become very poor. The composition does not function as a resist. By way of example, the amount of the radiation sensitive material to be used conventionally is about 25 parts by weight relative to 100 parts by weight of the resin component in the radiation sensitive composition.

To solve above-described problems, the techniques have been proposed in which two or more kinds of novolak resins derived from specific phenol compounds and having a specified molecular weight range are used as the novolak resin (Japanese Unexamined Patent Publication No. H07-271024); a novolak resin derived from a specific phenol compound and having a specified molecular weight range and degree of dispersion is used as the novolak resin and further a polyhydroxy compound having phenolic hydroxyl groups is used (Japanese Unexamined Patent Publication No. H08-184963); and a radiation sensitive component comprising a mixture of a naphthoquinonediazide-sulfonic acid ester of trihydroxybenzophenone and trihydroxybenzophenone in a certain ratio is used (Japanese Unexamined Patent Publication No. H08-82926).

Further, when the conventional radiation sensitive composition is applied onto a large glass substrate, there arises the problem that the uniformity of pattern line width on the surface cannot be sufficiently achieved because of the increase of uneven application or the uneven thickness of the resist film. To improve the coating properties of such a radiation sensitive composition, the addition of a surfactant to the radiation sensitive composition and the type and amount of the surfactant to be added have been examined. Further, in the examination of solvent as improvement of coating properties, use of a solvent having a specific boiling point, kinematic viscosity and evaporation rate (Japanese Unexamined Patent Publication No. 10-186637) and use of a mixed solvent containing as one component therein a solvent selected from propylene glycol and dipropylene glycol (Japanese Unexamined Patent Publication No. 10-186638) are reported.

However, even by these various proposals, there is none of the radiation sensitive composition which can simultaneously and sufficiently solve the problems of sensitivity, resist layer-remaining properties, resolution, reproducibility of patterns, improvement of throughput during production, coating properties, process dependency etc. Therefore it is desired to provide a radiation sensitive composition free of such problems, that is, capable of simultaneously and sufficiently solving the problems of high sensitivity, highly normalized film remaining characteristics, high resolution, excellent reproducibility of patterns, improvement of throughput during production, good coating properties, low process dependency etc. Further, for reducing the costs of the radiation sensitive composition, it is also desired to reduce the amount of a radiation sensitive material to be added which has a high unit cost, but if the amount of the radiation sensitive material to be added is reduced, there arise the problems described above.

On the other hand, it is known that by mixing two or more resins having different refractive indexes so as to satisfy specific conditions, there occurs the phenomenon of light scattering. For example, Japanese Unexamined Patent Publication No. H05-249319 shows that a polymerizable monomer is mixed with polymer solid particles, a monomer or a liquid each having a refractive index different from the polymerizable monomer, and the mixture is polymerized to obtain a light-scattering and light-piping body which can guide an incident light from a single or many directions while the light is scattered. As typical application examples using this effect of light scattering, plated wave-guides for back light of liquid crystal displays (for example, Japanese Unexamined Patent Publication Nos. H06-186560, H07-169311 etc.) can be mentioned. In addition, Japanese Unexamined Patent Publication No. H08-255983 discloses a method wherein a radiation sensitive composition insulator containing in a negative-working radiation sensitive composition a light scattering filler having a refractive index different by 0.1 to 0.7 from the negative-working radiation sensitive composition is used, and via holes tapered by light scattering are formed. However, this does not improve the sensitivity and development properties of the radiation sensitive composition.

Under the circumstances described above, an object of the present invention is to provide a radiation sensitive composition having sensitivity equal to or higher than in the conventional one and highly normalized film remaining characteristics even when the amount of a radiation sensitive material contained in the radiation sensitive composition is reduced than that in the conventional one.

Another object of the present invention is to provide a radiation sensitive composition which permits highly normalized film remaining characteristics and high sensitivity to practically stand together, is excellent in development properties, and can form excellent patterns.

A further object of the present invention is to provide a radiation sensitive composition which has excellent coating properties, excellent line width uniformity of resist patterns, and low process dependency as well as satisfies the characteristics described above.

DISCLOSURE OF THE INVENTION

As a result of eager study and examination, the present inventors found that in a radiation sensitive composition comprising resins and a radiation sensitive material, the working effect of the radiation sensitive material can be increased using at least two kinds of resin having refractive indexes different from each other by 0.03 or more as the resins, and therefore the amount of the radiation sensitive material used can be reduced, and also that by incorporating a resin working as a dissolution inhibitor into a radiation sensitive composition comprising an alkali-soluble resin and a quinonediazide radiation sensitive agent, excellent resist patterns can be formed without a reduction in thickness of resist layer after development even if the amount of the radiation sensitive material to be added is reduced, thus having achieved the present invention based on the finding.

That is, in the first aspect of the present invention, the present invention relates to a radiation sensitive composition comprising a resin composition and a radiation sensitive material, wherein the resin composition comprises two or more kinds of resins different in refractive index, further where the resins have a difference in refractive index of at least 0.03.

Further, in the second aspect of the present invention, the present invention relates to a radiation sensitive composition comprising a resin composition and a radiation sensitive material, wherein the resin composition comprises at least (a) a resin component of an alkali-soluble resin and (b) a resin additive working as a dissolution inhibitor, and the radiation sensitive material is (c) a radiation sensitive material containing a quinonediazide group.

Hereinafter, the present invention is described in detail.

In the first aspect of the present invention, the radiation sensitive composition shall contain at least a pair of resins with a refractive index difference ($\Delta n$) of 0.03 or more each other as a resin composition. The type and number of the resins used is not limited in the present invention. As one of the resins having different refractive indexes and used as a resin component in the resin composition of these radiation sensitive compositions, that is the resin component, there is preferably illustrated an alkali-soluble resin. When the alkali-soluble resin is used as the resin component in the resin composition, the radiation sensitive composition of the first present invention comprises (a) a resin component comprising an alkali-soluble resin and (b) a resin additive having a different refractive index of 0.03 or more relative to that of the resin of the resin component. Further, a novolak resin is preferably used as the alkali-soluble resin in the first present invention.

According to the first present invention, the working effect of the radiation sensitive material is improved using at least a pair of resins with a refractive index difference ($\Delta n$) of 0.03 or more each other as the resin composition used in the radiation sensitive composition. As a result, the amount of the radiation sensitive material used in the radiation sensitive composition can be reduced and the improvement of throughput can also be achieved by higher sensitization of the radiation sensitive composition.

However, when e.g. an alkali-soluble resin is used as the resin component and a quinonediazide radiation sensitive agent is used as the radiation sensitive material in the radiation sensitive composition described above, resist layer-remaining properties of the radiation sensitive composition may be lowered depending on the resin used as the resin additive in the case where the amount of the radiation sensitive additive to be added is lower than conventional. If the resin additive could work as a dissolution inhibitor for the radiation sensitive composition, no deterioration in such resist layer-remaining properties was found. The reason is ascribed as follows. In the case of the conventional radiation sensitive composition where only the novolak resin i.e. an alkali-soluble resin is used as the resin component in the radiation sensitive composition, the rate of dissolution of the radiation sensitive composition in an alkali developing solution depends considerably on the weight average molecular weight of the novolak resin and the amount of the radiation sensitive material to be added. When these are regulated to attain higher sensitivity, the development properties and resist layer-remaining properties are deteriorated as described above. However if the novolak resin is used in combination with a resin working as a dissolution inhibitor as the resin additive, the highly normalized film remaining characteristics are maintained even if the amount of the radiation sensitive material relative to the novolak resin is reduced, and higher sensitivity due to the use of a small amount of the radiation sensitive material is obtained, thus being achieved higher sensitization without any deterioration in the resist layer-remaining properties.

In the second present invention using the resin which works as a dissolution inhibitor, sensitivity can be improved by reducing the amount of the radiation sensitive material to be added, and thus it is not always necessary to use a resin as the resin additive having a refractive index different by 0.03 or more from the refractive index of the resin component. However, if the refractive index of the resin as the resin additive is different by 0.03 or more from the refractive index of the resin as the resin component, the sensitivity of the radiation sensitive composition can thereby be improved so that further good results can be obtained from the viewpoint of the reduction of the amount of the radiation sensitive material added. Accordingly, even in the second aspect of the invention, the refractive index of the resin as the resin additive is different preferably by 0.03 or more from the refractive index of the alkali-soluble resin.

In the present invention, the "resin working as a dissolution inhibitor" refers to a resin which when added together with the resin as the resin component to the radiation sensitive composition, can inhibit the rate of dissolution in developing solution of the radiation sensitive composition film in non-exposed portion thereof, as compared with the case where the resin is not added.

As the resin working as a dissolution inhibitor, a resin showing a rate of dissolution of 5000 Å/min. or less in 2.38 weight-% aqueous solution of tetramethyl ammonium hydroxide is preferable when added to the radiation sensitive composition.

Moreover, it is necessary that the respective resins used in the radiation sensitive composition of the present invention can be dissolved in the same solvent even if there is a difference in solubility among them.

The reason that the working effect of the radiation sensitive material in the radiation sensitive composition can be improved by use of two or more resins having different refractive indexes is not sufficiently elucidated but considered to be as follows. However, the following is not intended to limit the present invention.

That is, in the present invention, the radiation sensitive composition comprising two or more resins having different refractive indexes is applied to form a photoresist film. The present inventors confirmed that even if a film is formed from a solution prepared by dissolving in a solvent two or more resins having different refractive indexes, the film thus formed has a heterogeneous structure at the micron level, which is irradiated with light to bring about the phenomenon of light scattering. This phenomenon can also be confirmed by irradiation of the resin solution with laser light. For example, when a solution with a single composition of a novolak resin or a polymethyl methacrylate resin is irradiated with laser light, the laser light advances without scattering. However when a resin solution consisting of a mixture of a novolak resin and, for example, polymethyl methacrylate having a refractive index different from that of the novolak resin is irradiated with laser light, the phenomenon of light scattering can be confirmed in a light entering portion.

The reason that a film formed by applying a solution of two or more resins having different refractive indexes each other in solvent still possesses a micro-heterogeneous structure is considered due to the difference of the solubility of each resin in the solvent. That is, the resin solution is applied to form a coating layer, and then the solvent is evaporated from the coating layer by baking. On the baking the resin having a lower solubility in the solvent is first precipitated to form solids, and thereafter the resin having a higher solubility in the solvent is precipitated to form a micro-heterogeneous structure, thus providing conditions for light scattering.

When the film formed from the radiation sensitive composition containing two or more resins having different refractive indexes is irradiated with light, the phenomenon of light scattering in the film occurs owing to the factor described above. When the film is exposed, the incident light is repeatedly scattered in the film thus providing a very long light path to improve the efficiency of utilization of irradiation light significantly, as compared with the light path in a film formed from the conventional radiation sensitive composition showing none of the phenomenon of light scattering. While the conventional radiation sensitive composition is poor in the efficiency of utilization of irradiation light because irradiation light is reflected and lost towards the outside of the radiation sensitive resin film, the radiation sensitive composition of the present invention achieves a very high efficiency of utilization of irradiation light because the distance of incident light transmitted is made longer by the effect of light scattering, whereby the working effect on the radiation sensitive material is significantly improved and higher sensitivity can be achieved.

Hereinafter, the resin component, the resin additive, and another components of the radiation sensitive composition in the present invention will be described below respectively in more detail.

Resin Component

As a resin of the resin component composing the resist composition in the radiation sensitive composition of the present invention, any resins used as resin components in the conventional radiation sensitive composition can be used. Among the resin components used in the conventional radiation sensitive composition, an alkali-soluble resin is preferable as the resin component of the present invention.

The alkali-soluble resin used in the radiation sensitive composition of the present invention may be any alkali-soluble resin used in the conventional radiation sensitive composition known in the art. As the alkali-soluble resin, novolak resin is preferable, but this does not particularly limit the present invention.

An alkali-soluble novolak resin preferably used in the present invention is obtainable by a polycondensation between one kind of phenols or a mixture thereof and at least one kind of aldehydes such as formalin.

As the phenols to be used for preparing the novolak resin, there may be illustrated, for example, phenol, p-cresol, m-cresol, o-cresol, 2,3-dimethylphenol, 2,4- dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene-bisphenol, methylene-bisp-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, o-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol, and the like. These are used independently or as a mixture of two or more thereof.

As the aldehydes, there may be illustrated paraformaldehyde, acetaldehyde, benzaldehyde, hydroxybenzaldehyde, chloroacetaldehyde, etc. as well as formalin. These are used singly or as a mixture of two or more thereof.

The weight average molecular weight of the novolak resin used in the radiation sensitive composition of the present invention, as determined using polystyrene standards, is preferably 2,000 to 50,000, more preferably 3,000 to 30,000, and most preferably 3,000 to 15,000.

Resin Additive

The resin as the resin additive composing the resin composition in the radiation sensitive composition of the present invention may be any resin which has a refractive index different by 0.03 or more from that of the resin component and/or works as a dissolution inhibitor. The resin having such characteristics includes polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone.

Among these resins, the resin as the resin additive in the present invention is preferably polyacrylic ester, polymethacrylic ester, polystyrene derivatives, and copolymers obtained from at least two kinds of monomers selected from acrylic esters, methacrylic esters and styrene derivatives. If a repeating unit having a carboxyl group or a carboxylic anhydride group is further contained in these resins, an alkali-insoluble portion of the polymer consisting of a repeating unit part derived from acrylic esters, methacrylic esters, styrene derivatives, etc. shows a dissolution inhibiting effect, while an alkali-soluble portion consisting of a repeating unit part having a carboxyl group or a carboxylic anhydride group improves the solubility of the radiation sensitive composition in a developing solution, whereby the dissolution inhibiting effect and solubility improvement effect of the radiation sensitive composition can be preferably balanced by use of the resin additive.

Accordingly, as the resin of the resin additive, copolymers obtained from at least one member selected from acrylic ester, methacrylic ester and styrene derivatives and an organic acid monomer having a carboxyl group or a carboxylic anhydride group are also a preferable resin.

Examples of polyacrylic ester, polymethacrylic ester and polystyrene derivatives which can be preferably used as the resin of the resin additive in the present invention are as follows.

Polyacrylic Ester:

Polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate etc.

Polymethacrylic Ester:

Polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate etc.

Polystyrene Derivatives:

Poly-4-fluorostyrene, poly-2,5-difluorostyrene, poly-2,4-difluorostyrene. poly-p-isopropylstyrene, polystyrene, poly-o-chlorostyrene, poly-4-acetylstyrene, poly-4-bezoylstyrene, poly-4-bromostyrene, poly-4-butoxycarbonylstyrene, poly-4-butoxymethylstyrene, poly-4-butylstyrene, poly-4-ethylstyrene, poly-4-hexylstyrene, poly-4-methoxystyrene, poly-4-methylstyrene, poly-2,4-dimethylstyrene, poly-2,5-dimethylstyrene, poly-2,4,5-trimethylstyrene, poly-4-phenylstyrene, poly-4-propoxystyrene, polyaminostyrene etc.

As monomers preferably used for preparing a copolymer obtained from at least two monomers selected from acrylic ester, methacrylic ester, and styrene derivatives or a copolymer obtained from at least one of these monomers and an organic acid monomer having a carboxy group or a carboxylic anhydride group, there are illustrated monomers used for preparing above described polyacrylic ester, polymethacrylic ester and polystyrene derivative with regard to acrylic ester, methacrylic ester and styrene derivatives. As organic acid monomers having a carboxyl group or a carboxylic anhydride group, there are preferably illustrated as followed.

Organic Acid Monomer Having a Carboxyl Group or a Carboxylic Anhydride Group:

Acrylic acid, methacrylic acid, itaconic acid, maleic anhydride, 2-acryloylhydrogenphthalate, 2-acryloyloxypropyl hydrogenphthalate etc.

The copolymer containing an acid component in repeating units, used preferably in the present invention, can be produced in a usual manner by copolymerizing at least one kind of monomer selected from monomers such as the acrylic esters, methacrylic esters and styrene derivatives described above with at least one kind of monomer selected from the organic acid monomers described above. As acrylic copolymers among these copolymers there are preferably illustrated copolymers between one kind of monomer selected from the acrylic esters and methacrylic esters described above and at least one kind of organic acid monomer selected from the organic acid monomers described above, and copolymers between two kinds of monomers selected from the acrylic esters and methacrylic esters described above and at least one kind of organic acid monomer selected from the organic acid monomers described above, and more preferably copolymers between methyl methacrylate, at least one kind of methacrylic ester excluding methyl methacrylate, and at least one member selected from acrylic acid and methacrylic acid.

When the acid value of polyacrylic ester- or polymethacrylic ester-based resin and polystyrene derivative-based resin made of a copolymer obtained from at least one kind of monomer selected from the acrylic esters, methacrylic esters and styrene derivatives and an organic acid monomer having a carboxyl group or a carboxylic anhydride group is 1 to 80 mg KOH/g, the good coating properties of the radiation sensitive composition can be preferably obtained. It was also found that the resin having an acid value of 1 to 80 mg KOH/g can be used as the resin of the resin additive to achieve excellent line width uniformity with low process dependency of resist patterns. The acid value of the polyacrylic ester- or polymethacrylic ester-based resin or polystyrene derivative-based resin is more preferably 2 to 30 mg KOH/g.

When the organic acid monomer is used as a copolymerizable component in the copolymer, the amount of the organic acid monomer used is preferably 0.1 to 10.0 parts by weight, more preferably 0.5 to 3.0 parts by weight, relative to 100 parts by weight of the other monomer components.

The copolymer containing the acid component described above is not limited to a product obtained by copolymerizing monomers corresponding to repeating units constituting the copolymer described above. The copolymer containing the acid component may be one prepared by an arbitrary method such as a method of introducing an acid component into a polymer, for example by hydrolyzing a polymer having at least one kind of acrylic ester and methacrylic ester polymerized therein.

The weight average molecular weight of the resin as the resin additive, as determined using polystyrene standards, is preferably 2,000 to 80,000. When the resin contains styrenic monomer-repeating units of less than 50 mole-% of repeating units in the resin, such as polyacrylic acid ester- or polymethacrylic acid ester-based resin, the weight average molecular weight of the resin as determined using polystyrene standards, is more preferably 5,000 to 40,000 and most preferably 7,000 to 20,000. When the resin contains styrenic monomer-repeating units of not less than 50 mole-% of repeating units in the resin, such as polystyrene derivatives, the weight average molecular weight of the resin is more preferably 3,000 to 25,000 and most preferably 5,000 to 20,000.

Such resins consisting of homopolymers or copolymers may be used singly or in combination thereof as the resin additive.

The refractive indexes of some of the above-exemplified resins as the resin additive are shown below. The refractive index of the novolak resin used preferably as the resin component is 1.64 as determined at a wavelength of 436 nm (hereinafter, reflective index at a wavelength of 436 nm is shown).

Resins Having a Refractive Index of Less Than 1.50:
Polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polymethyl acrylate, polyethyl acrylate, poly-n-butyl acrylate and polyvinyl acetate etc.

Resins Having a Refractive Index of 1.50 to 1.60:
Polycyclohexyl methacrylate, polybenzyl methacrylate, polyphenyl methacrylate, poly-1-phenylethyl methacrylate, poly-2-phenylethyl methacrylate, polyfurfuryl methacrylate, polybenzyl acrylate, poly-2-chloroethyl acrylate, polyvinyl benzoate, polyvinyl phenylacetate, polyvinyl chlorocetate, polyacrylonitrile, poly-α-methylacrylonitrile, polymethyl-α-chloroacrylate, poly-p-fluorostyrene, poly-o,p-fluorostyrene, poly-p-isopropylstyrene, polystyrene and polydiphenylmethyl methacrylate etc.

Resins Having a Refractive Index of More Than 1.60:
Polyphenyl-α-bromoacrylate, polynaphthyl methacrylate, polyvinylphthalimide and poly-o-chlorostyrene, polypentachlorophenyl methacrylate etc.

As the resin of the resin additive used together with the novolak resin, polymers of methacrylic esters such as polymethyl methacrylate, polyethyl methacrylate, poly-n-propylmethacrylate, poly-n-butyl methacrylate, poly-n-hexyl methacrylate, polyisopropyl methacrylate, polyisobutyl methacrylate, poly-t-butyl methacrylate, polydiphenylmethyl methacrylate, polypentachlorophenyl methacrylate etc., polymers of polystyrene derivatives such as polystyrene or copolymers obtained using, as at least one of copolymer components, monomer(s) used for producing these polymers are particularly preferable resins.

Because the proportion of the amount of the resin additive to the amount of the resin component is varied depending on the type of resin used as the resin component and the resin additive, it is difficult to define a generally preferable range thereof. By way of example, in a combination of novolak resin of the alkali-soluble resin and a resin of resin additive such as a homopolymer or copolymer of methacrylic ester containing styrene derivative-repeating units, that is styrenic monomer-repeating units of less than 50 mole-% of repeating units in the resin, the amount of the resin additive is preferably 1 to 20 parts by weight, more preferably 1 to 15 parts by weight, relative to 100 parts by weight of novolak resin. When the resin additive is a styrenic resin having styrenic monomer-repeating units of not less than 50 mole-% of repeating units in the resin, the amount of the styrenic resin is preferably 0.5 to 5.0 parts by weight, more preferably 1.0 to 3.0 parts by weight, relative to 100 parts by weight of the novolak resin.

Other Resin Components Than the Resin Component and Resin Additives

In the resin composition used in the radiation sensitive composition of the present invention, for balancing the dissolution inhibiting effect with the solubility improvement of the radiation sensitive composition, a polymer having carboxyl group or a carboxylic anhydride group-repeating units of 50 mole-% or more of repeating units in the resin can be further contained in addition to the resin component consisting of the alkali-soluble resins and the resin additive described above. The proportion of such a homopolymer of the organic acid monomer or a copolymer containing the organic acid monomer as a major component of the copolymer to the resin additive is preferably 0.1 to 10.0 parts by weight, more preferably 0.5 to 3.0 parts by weight, relative to 100 parts by weight of the resin additive. The amount of such resin components other than the resin component and the resin additive, in terms of the total amount thereof with the resin additive, is 1 to 20 parts by weight, more preferably 1 to 10 parts by weight and most preferably 2 to 5 parts by weight, relative to 100 parts by weight of the novolak resin.

The polymers containing repeating-units having a carboxyl group or a carboxylic anhydride group of 50 mole-% or more of repeating units to be preferably used in this invention are as follows.

Polymers Containing Organic Acid Monomers of 50 mole-% or More of Monomer Components:

Polyacrylic acid, polymethacrylic acid, polyitaconic acid, polymaleic anhydride, poly-2-acryloyl hydrogenphthalate, and poly-2-acryloyloxypropyl hydrogenphthalate, as well as copolymers prepared using 50 mole-% or more of monomers used for preparing these polymers as a monomer component.

Further, it is more preferable that the radiation sensitive composition of the present invention, wherein the value of X which is B/A is in the range of 0.01 to 0.13 whereupon A is an integrated area beneath peaks in the range of 7.2 to 5.6 ppm and B is an integrated area beneath peaks in the range of 1.3 to 0.95 ppm in a $^1$H-NMR spectrum of a solution of the resin components in heavy acetone.

In the present invention, the integrated value A of peaks in the range of 7.2 to 5.6 ppm and the integrated value B of peaks in the range of 1.3 to 0.95 ppm in a $^1$H-NMR spectrum of a solution of the resin composition in heavy acetone are found by integrating areas beneath peaks in the range of 7.2 to 5.6 ppm or 1.3 to 0.95 ppm in NMR spectrum of the resin composition measured in the following manner, and the values thus obtained are used to calculate X=B/A.

First, the alkali-soluble resin is dissolved in propylene glycol monomethyl ether acetate, and this solution is spin-coated on a substrate to form a film thereon. This film is dissolved in heavy acetone to prepare a NMR spectrum measurement sample, and measurement of its $^1$H-NMR spectrum is conducted using the sample, and on the basis of the resulting chart, the integrated value of peaks in the range of 7.2 to 5.6 ppm is calculated as A, and the integrated value of peaks in the range of 1.3 to 0.95 ppm excluding a peak of propylene glycol monomethyl ether acetate as the solvent is calculated as B, to calculate B/A to give X.

Radiation Sensitive Material

The radiation sensitive material used in the radiation sensitive composition of the present invention may be any radiation sensitive material used in the conventional radiation sensitive composition comprising a resin component and a radiation sensitive material.

In the radiation sensitive composition of the present invention, when the alkali-soluble resin is used as the resin component of the resin composition, a radiation sensitive material containing a quinonediazide group or groups is preferable as the radiation sensitive material.

The radiation sensitive materials having a quinonediazide group or groups used in the present invention may be any one of the conventionally known radiation sensitive materials having quinonediazide group or groups. Preferred examples of the radiation sensitive materials having quinonediazide group or groups include a compound obtainable from the reaction between a naphthoquinonediazidesulfonic acid halide such as 1,2-naphthoquinonediazide-4-sulfonyl chloride and 1,2-naphthoquinonediazide-5-sulfonyl chloride or quinonediazidesulfonic acid halide such as benzoquinonediazidesulfonic acid chloride, and a low molecular compound or a high molecular compound having a functional group capable of reacting with the acid halide by condensation. Examples of the functional group capable of condensing with the acid halide include a hydroxyl group, an amino group, and so on. Among these groups, a hydroxyl group is particularly suitable.

Examples of the above-described low molecular compound containing hydroxyl group or groups include hydroquinone, resorcinol, 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,2',3,4,6'-pentahydroxybenzophenone etc. Examples of the high molecular compound containing hydroxyl group include novolak resin and polyhydroxystyrene etc.

From the viewpoint of use of a lower amount of the radiation sensitive material, when the resin of the resin additive consist of one containing styrenic monomer-repeating units or less than 50 mole-% of repeating units in the resin, the radiation sensitive material containing quinonediazide group or groups is used preferably in an amount of 1 to 20 parts by weight relative to 100 parts by weight of the alkali-soluble resin in the radiation sensitive composition of the present invention. Further, when the resins working as a dissolution inhibitor are used as the resin additive, from the viewpoint of the coating properties of the radiation sensitive composition, the amount of the radiation sensitive material containing quinonediazide group or groups is often more desirably 1 to 18 parts by weight relative to 100 parts by weight of the alkali-soluble resin in the radiation sensitive composition. Additionally, when the resin containing styrenic monomer-repeating units of 50 mole-% of repeating units in the resin is used as the resin additive, the amount of the radiation sensitive material containing quinonediazide group are preferably 10 to 30 parts by weight, more preferably 15 to 25 parts by weight relative to 100 parts by weight of the alkali-soluble resin in the radiation sensitive composition. If the contents of the radiation sensitive material are less than 10 parts by weight, the resist layer-remaining rate of the radiation sensitive composition tends to lower. Further, if the contents of the radiation sensitive material are more than 30 parts by weight, it is not practically as the sensitivity of the radiation sensitive composition is too low.

Additives

In addition, a low-molecular compound represented by the general formula (I) below and having phenolic hydroxyl group or groups can be added in the radiation sensitive composition of the present invention.

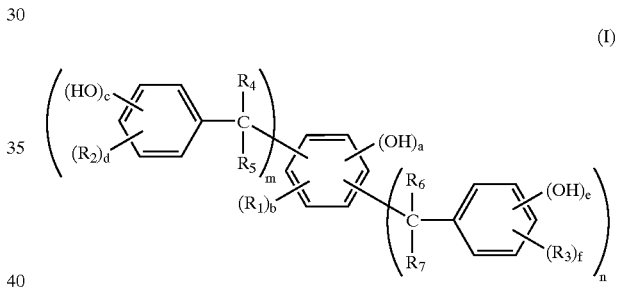

(I)

Wherein $R_1$, $R_2$, $R_3$, $R_4$, $R_5$, $R_6$ and $R_7$ each represents independently H, a $C_1$ to $C_4$ alkyl group, a $C_1$ to $C_4$ alkoxyl group, a cyclohexyl group or a group represented by the formula:

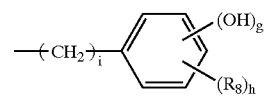

wherein $R_8$ represents H, a $C_1$ to $C_4$ alkyl group, a $C_1$ to $C_4$ alkoxyl group or a cyclohexyl group; each of m and n is 0, 1 or 2; each of a, b, c, d, e, f, g and h is 0 or an integer of 1 to 5 satisfying a+b≦5, c+d≦5, e+f≦5, and g+h≦5; and i is 0, 1 or 2.

The low-molecular compound having phenolic hydroxyl group or groups represented by the above general formula (I) is preferably used as a dissolution accelerator usually for regulating dissolution rate of the radiation sensitive composition of the present invention, or improving or regulating the sensitivity of the radiation sensitive composition.

As the low-molecular compound having phenolic hydroxyl group or groups represented by the above general formula (I), there are illustrated, for example, o-cresol, m-cresol, p-cresol, 2,4-xylenol, 2,5-xylenol, 2,6-xylenol, bisphenol A. B, C, E, F, or G, 4,4',4"-methylidinetrisphenol, 2,6-bis[(2-hydroxy-5-methylphenol)methyl]-4-methylphenol, 4,4'-[1-[4-[1-(4-hydroxyphenyl)-1-methylethyl]phenyl]ethylidene]bisphenol, 4,4',4"-ethylidinetrisphenol, 4-[bis(4-hydroxyphenyl)methyl]-2-ethoxyphenol, 4,4'-[(2-hydroxyphenyl)methylenelbis[2,3-dimethylphenol], 4,4'-[(3-hydroxyphenyl)methylene]bis[2,6-dimethylphenol], 4,4'-[(4-hydroxyphenyl)methylene]bis[2,6-dimethylphenol], 2,2'-[(2-hydroxyphenyl)methylene]bis[3,5-dimethylphenol], 2,2'-[(4-hydroxyphenyl)methylene]bis[3,5-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,6-bis[(3,5-dimethyl-4-hydroxyphenyl)methyl]-1,2,3-benzenetriol, 4,4'-[(2-hydroxyphenyl)methylene]bis[3-methylphenol], 4,4',4"-(3-methyl-1-propanyl-3-ylidine)trisphenol, 4,4',4",4'"-(1,4-phenylenedimethylidine)tetrakisphenol, 2,4,6-tris[(3,5-dimethyl-4-hydroxyphenyl)methyl]-1,3-benzenediol, 2,4,6-tris[(3,5-dimethyl-2-hydroxyphenyl)methyl]-1,3-benzenediol, 4,4'-[1-[4-[1-[4-hydroxy-3,5-bis[(hydroxy-3-methylphenyl]methyl]phenyl]-1-methylethyl]phenyl]ethylidene]bis[2,6-bis(hydroxy-3-methylphenyl)methyl]phenol, and the like. These low-molecular compounds having phenolic hydroxyl group or groups are used in an amount of usually 1 to 20 parts by weight, preferably 3 to 15 parts by weight relative to 100 parts by weight of the novolak resin.

Further, dyestuffs, adhesive aids, surfactants etc. may be incorporated as necessary into the radiation sensitive composition of the present invention. The dyestuffs include e.g. Methyl Violet, Crystal Violet, Malachite Green etc.; the adhesive aids include e.g. alkyl imidazoline, butyric acid, alkyl acid, polyhydroxystyrene, polyvinylmethyl ether, t-butyl novolak, epoxy silane, epoxy polymer, silane etc.; and the surfactants include e.g. nonionic surfactants such as polyglycols and derivatives thereof, that is, polypropylene glycol or polyoxyethylene lauryl ether, fluorine-containing surfactants such as Fluorad (trade name; manufactured by Sumitomo 3M Ltd.), Megafac (trade name; manufactured by Dainippon Ink & Chemicals, Inc.), Sulflon (trade name; manufactured by Asahi Glass Co., Ltd.) or organosiloxane surface active agents such as KP341 (trade name; Shin-Etsu Chemical Co., Ltd.).

Solvent

The examples of solvents for dissolving the resin component of the resin composition, the radiation sensitive material, other additives etc. contained in the radiation sensitive composition of the present invention include ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate; aromatic hydrocarbons such as toluene and xylene; ketones such as methyl ethyl ketone, 2-heptanone, and cyclohexanone; amides such as N,N-dimethylacetamide and N-methylpyrrolidone; lactones such as γ-butyrolactone; and so on. These solvents are used singly or in a combination of two or more thereof.

In the present invention, the rates of dissolution of the radiation sensitive composition in 2.38 weight-% aqueous solution of tetramethyl ammonium hydroxide are measured and calculated in the following manner.

(Method of Measuring the Rate of Dissolution of the Radiation Sensitive Composition)

The radiation sensitive composition was spin-coated on a silicon wafer and baked at 100° C. for 90 seconds on a hot plate to give a photoresist film of about 1.5 μm in thickness. The thickness $d_1$ (Å) of the photoresist film at this time was measured, and this resist film was exposed through a test pattern with line and space patterns having various line and space widths and a line-to-space width ratio of 1:1, using an FX-604F stepper manufactured by Nikon Co. Thereafter, it was developed at 23° C. for 60 seconds with 2.38 weight-% aqueous solution of tetramethyl ammonium hydroxide. After development, the thickness $d_2$ (Å) of the photoresist film was measured again, and the rate of dissolution (Å/min.) was determined from the difference ($d_1$–$d_2$) in the thickness of the film before and after development.

BEST MODE FOR PRACTICING THE INVENTION

Figure 1:
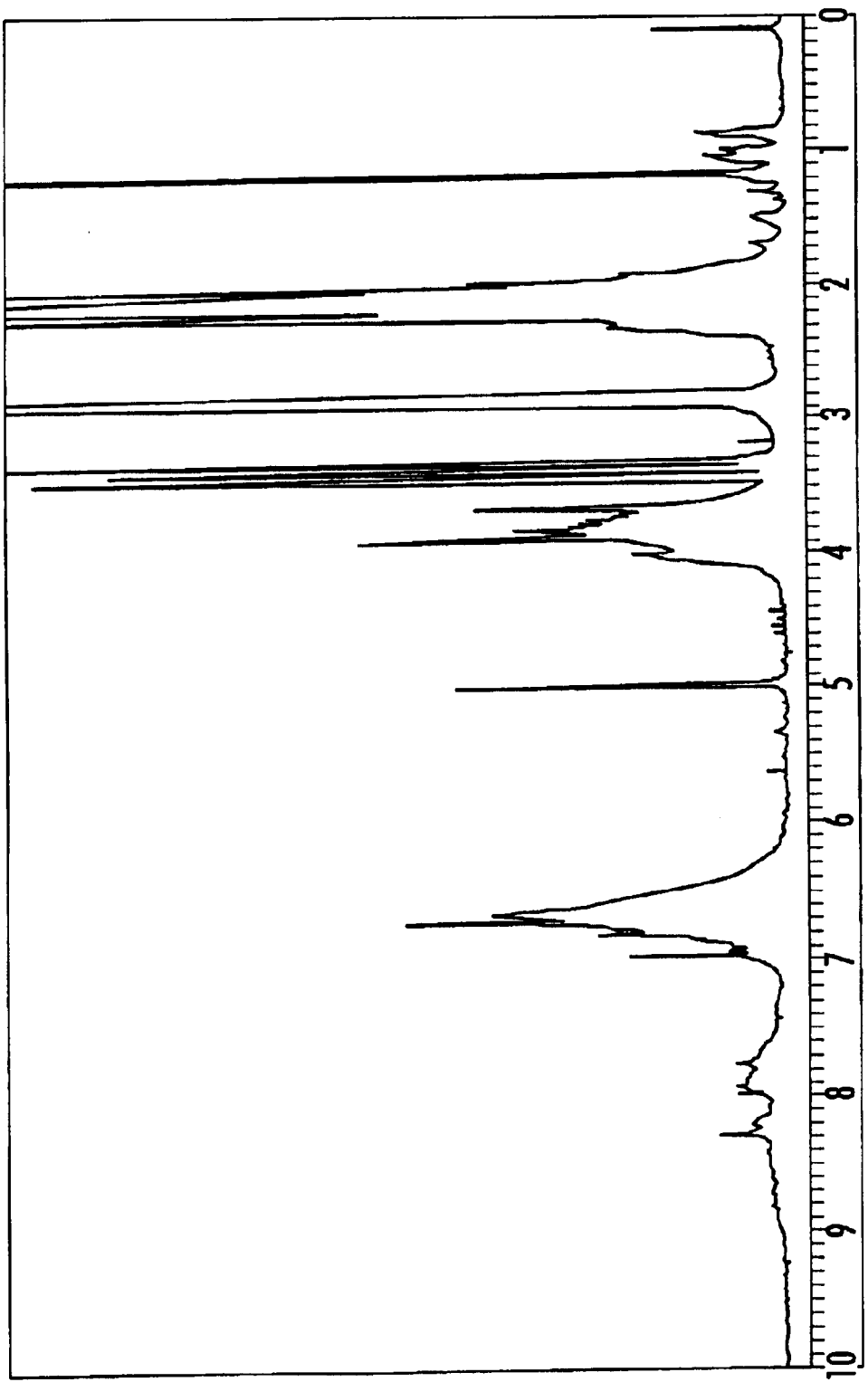
FIG. 1 is a $^1$H-NMR spectrum chart of a resin composition obtained by measuring a film of a mixed resin consisting of a novolak resin and an acrylic polymer (100:10) as a sample.

The present invention will now be described more specifically by reference to Examples, Comparative Examples and Synthesis Examples which, however, are not to be construed to limit the present invention in any way. Additionally, in the following Examples, "molecular weight" or "weight average molecular weightn" means "weight average molecular weight as determined using polystyrene standards" unless otherwise specified.

SYNTHESIS EXAMPLE

Synthesis Example 1

900 g of propylene glycol monomethyl ether acetate, 189 g of methyl methacrylate, 81 g of t-butyl methacrylate, 30 g of acrylic acid, 6 g of azobisdimethylvaleronitrile and 4.5 g of azobismethylbutyronitrile were charged into a 2000-ml four-necked flask equipped with a stirrer, a cooling tube, a thermometer and a nitrogen-introducing tube, and stirred. Then, the temperature of the contents was raised while blowing nitrogen thereinto, and polymerization was conducted at 85° C. for 8 hours to obtain an acrylic copolymer of 15,000 in weight average molecular weight and 80 mg KOH/g in acid value.

Synthesis Example 2

900 g of propylene glycol monomethyl ether acetate, 207.9 g of methyl methacrylate, 89.1 g of t-butyl methacrylate, 3 g of acrylic acid, 6 g of azobisdimethylvaleronitrile and 4.5 g of azobismethylbutyronitrile were charged into a 2000-ml four-necked flask equipped with a stirrer, a cooling tube, a thermometer and a nitrogen-introducing tube, and stirred. Then, the temperature of the contents was raised while blowing nitrogen thereinto, and polymerization was conducted at 85° C. for 8 hours to obtain an acrylic copolymer of 13,000 in weight average molecular weight and 8 mg KOH/g in acid value.

Synthesis Example 3

900 g of propylene glycol monomethyl ether acetate, 207.9 g of methyl methacrylate, 89.1 g of n-butyl methacrylate, 3 g of acrylic acid, 6 g of azobisdimethylvaleronitrile and 4.5 g of azobismethylbutyronitrile were charged into a 2000-ml four-necked flask equipped with a stirrer, a cooling tube, a thermometer and a nitrogen-introducing tube, and stirred. Then, the temperature of the contents was raised while blowing nitrogen thereinto, and polymerization was conducted at 85° C. for 8 hours to obtain an acrylic copolymer of 13,000 in weight average molecular weight and 8 mg KOH/g in acid value.

Synthesis Example 4

900 g of propylene glycol monomethyl ether acetate, 207.9 g of methyl methacrylate, 89.1 g of cyclohexyl methacrylate, 3 g of acrylic acid, 6 g of azobisdimethylvaleronitrile and 4.5 g of azobismethylbutyronitrile were charged into a 2000-ml four-necked flask equipped with a stirrer, a cooling tube, a thermometer and a nitrogen-introducing tube, and stirred. Then, the temperature of the contents was raised while blowing nitrogen thereinto, and polymerization was conducted at 85° C. for 8 hours to obtain an acrylic copolymer of 12,000 in weight average molecular weight and 8 mg KOH/g in acid value.

Synthesis Example 5

900 g of propylene glycol monomethyl ether acetate, 210 g of methyl methacrylate, 90 g of t-butyl methacrylate, 0.3 g in of acrylic acid, 6 g of azobisdimethylvaleronitrile and 4.5 g of azobismethylbutyronitrile were charged into a 2000-ml four-necked flask equipped with a stirrer, a cooling tube, a thermometer and a nitrogen-introducing tube, and stirred. Then, the temperature of the contents was raised while blowing nitrogen thereinto, and polymerization was conducted at 85° C. for 8 hours to obtain an acrylic copolymer of 13,000 in weight average molecular weight and 1 mg KOH/g in acid value.

Synthesis Example 6

900 g of propylene glycol monomethyl ether acetate, 210 g of methyl methacrylate, 90 g of t-butyl methacrylate, 6 g of azobisdimethylvaleronitrile and 4.5 g of azobismethylbutyronitrile were charged into a 2000-ml four-necked flask equipped with a stirrer, a cooling tube, a thermometer and a nitrogen-introducing tube, and stirred. Then, the temperature of the contents was raised while blowing nitrogen thereinto, and polymerization was conducted at 85° C. for 8 hours to obtain an acrylic copolymer of 13,000 in weight average molecular weight and 0.3 mg KOH/g in acid value.

EXAMPLE AND COMPARATIVE EXAMPLE

Example 1

To 100 parts by weight of a novolak resin (refractive index at 436 nm: 1.64) were added 15 parts by weight of an esterification product between 2,3,4,4'-tetrahydroxybenzophenone and 1,2-naphthoquinonediazide-5-sulfonyl chloride (as a radiation sensitive material) and 5 parts by weight of polymethyl methacrylate (PMMA; refractive index at 436 nm: 1.48) having a refractive index different from that of the novolak resin by 0.03 or more and working as a dissolution inhibitor, and the resulting mixture was dissolved in propylene glycol monomethyl ether acetate. After adding thereto 300 ppm of a fluorine-containing surfactant of Fluorad-472 (manufactured by Sumitomo 3M Co.) for the purpose of preventing formation of radial wrinkles, so-called striation, to be formed on a resist layer upon spin coating, the solution was stirred and filtered through a 0.2-$\mu$m filter to prepare a radiation sensitive composition of the present invention. This composition was spin-coated on a 4-inch silicon wafer, and baked on a hot plate at 100° C. for 90 seconds to obtain a 1.5-$\mu$m thick resist layer. This resist layer was exposed by a g-line stepper made by GCA Co. (DSW 6400) through a test pattern with line and space patterns having various line and space widths and a line-to-space width ratio of 1:1, and developed in a 2.20 weight-% aqueous solution of tetramethylammonium hydroxide at 23° C. for 60 seconds. After completion of the development, thickness of the layer was again measured. Resist layer-remaining ratio was determined according to the following formula:

Resist layer-remaining ratio=[(thickness before development−thickness after development)/thickness before development]×100

In addition, an amount of exposure energy enough to resolve a a 5-$\mu$m line-and-space pattern to 1:1 is determined by observation, which was taken as a sensitivity. Thus, there were obtained the results shown in Table 1.

Examples 2 and 3 and Comparative Example 1

Procedures were conducted in the same manner as in Example 1 except for changing the amount of added PMMA as shown in Table 1 relative to 100 parts by weight of novolak resin. Thus, there were obtained the results shown in Table 1.

Example 4

Procedures were conducted in the same manner as in Example 1 except for adding 10 parts by weight of poly-n-butyl methacrylate (PnBMA; refractive index at 436nm: 1.47) in place of PMMA relative to 100 parts by weight of novolak resin. Thus, there were obtained the results shown in Table 1.

Example 5

Procedures were conducted in the same manner as in Example 1 except for adding 5 parts by weight of PMMA and 5 parts by weight of PnBMA in place of PMMA relative to 100 parts by weight of novolak resin. Thus, there were obtained the results shown in Table 1.

Example 6

Procedures were conducted in the same manner as in Example 1 except for adding 10 parts by weight of poly (methyl methacrylate-co-n-butyl methacrylate) [P(MMA-nBMA); refractive index at 436 nm: 1.48] in place of PMMA relative to 100 parts by weight of novolak resin. Thus, there were obtained the results shown in Table 1.

Example 7

Procedures were conducted in the same manner as in Example 1 except for adding 10 parts by weight of poly (methyl methacrylate-co-styrene) [P(MMA-St); refractive index at 436 nm: 1.52) in place of PMMA relative to 100 parts by weight of novolak resin. Thus, there were obtained the results shown in Table 1.

Example 8

Procedures were conducted in the same manner as in Example 1 except for adding 10 parts by weight of polydiphenylmethyl methacrylate (PDPMMA; refractive index at 436 nm: 1.59) in place of PMMA relative to 100 parts by weight of novolak resin. Thus, there were obtained the results shown in Table 1.

Example 9

Procedures were conducted in the same manner as in Example 1 except for adding 10 parts by weight of polypentachlorophenyl methacrylate (PPCPMA; refractive index at 436 nm: 1.61) in place of PMMA relative to 100 parts by weight of novolak resin. Thus, there were obtained the results shown in Table 1.

Comparative Example 1

Procedures were conducted in the same manner as in Example 1 except for not using PMMA to obtain results shown in Table 1.

TABLE 1

| | Resin additive added to novolak resin | Amount of added resin additive relative to 100 parts by weight of novolak resin (parts by weight) | Resist layer-remaining ratio (%) | Sensitivity (mJ/cm$^2$) |
|---|---|---|---|---|
| Example 1 | PMMA | 5 | 100 | 30 |
| Example 2 | PMMA | 10 | 100 | 25 |
| Example 3 | PMMA | 15 | 100 | 35 |
| Example 4 | PnBMA | 10 | 100 | 26 |
| Example 5 | PMMA/PnBMA | 5/5 | 100 | 25 |
| Example 6 | P(MMA-nBMA) | 10 | 100 | 25 |
| Example 7 | P(MMA-St) | 10 | 100 | 21 |
| Example 8 | PDPMMA | 10 | 100 | 29 |
| Example 9 | PPCPMA | 10 | 100 | 30 |
| Comparative Example 1 | — | 0 | 100 | 50 |

Additionally, resist patterns obtained in Examples 1 to 9 had a good pattern form with no scum.

Example 10

The radiation sensitive composition prepared in Example 1 was spin-coated on a glass substrate, and baked on a hot plate at 100° C. for 90 seconds to form a 1.2-µm thick resist layer. UV rays-visible light absorption spectrum of this resist layer was measured by means of a spectrophotometer (Cary 4E made by Barian Co.) for UV rays and visible light, and the layer was exposed by a g-line stepper, DSW6400 made by GCA Co., in an energy amount of 80 mJ/cm$^2$, followed by again measuring UV ray-visible light absorption spectrum. Decomposition ratio of the radiation sensitive material was determined from the change in absorbance before and after the exposure at 436 nm, wavelength of g-line according to the following formula:

Decomposition ratio=[(absorbance before exposure−absorbance after exposure)/absorbance before exposure]×100

Examples 11 and 12 and Comparative Example 2

Procedures were conducted in the same manner as in Example 10 except for changing the amount of added PMMA relative to 100 parts by weight of novolak resin as shown in Table 2 to obtain the results tabulated in Table 2.

TABLE 2

| | Amount of added PMMA relative to 100 parts by weight of novolak resin (parts by weight) | Decomposition ratio of a radiation sensitive material (% at 436 nm) |
|---|---|---|
| Example 10 | 5 | 48 |
| Example 11 | 10 | 51 |
| Example 12 | 15 | 46 |
| Comparative Example 2 | 0 | 39 |

It is seen from the above-described results of Examples 1 to 12 and Comparative Examples 1 to 2 that use of at least two kinds of resins different from each other by 0.03 or more in refractive index as resins in a resin composition to be used in a radiation sensitive composition enables one to obtain a radiation sensitive composition having high sensitivity, excellent developability and excellent resist layer-remaining property. It is also seen that improvement of sensitivity is attained by the improvement of decomposition ratio of radiation sensitive materials, i.e., improvement of the working effect of the radiation sensitive materials.

Example 13

100 parts by weight of novolak resin having a weight average molecular weight of 15,000, 15 parts by weight of an esterification product between 2,3,4,4'-tetrahydroxybenzophenone and 1,2-naphthoauinonediazide-5-sulfonyl chloride and 4.0 parts by weight of poly-t-butyl methacrylate having a weight average molecular weight of 18,000 were dissolved in propylene glycol monomethyl ether acetate and, for preventing formation of radial wrinkles, so-called striation, on a resist layer upon spin coating, 300 ppm of a fluorine-containing surfactant, Fluorad-472 (manufactured by Sumitomo 3M Co.) was added thereto. After stirring the mixture, it was filtered through a 0.2-µm filter to prepare a radiation sensitive composition of the present invention. Sensitivity and coating properties of the composition were measured in the following manner. Results thus obtainedare tabulated in Table 3.

Sensitivity

A radiation sensitive composition to be tested is spin-coated on a 4-inch silicon wafer, and baked on a hot plate at 100° C. for 90 seconds to form a 1.5-µm thick resist layer. This resist layer is exposed with various exposure energies by a g-line stepper made by Nikon Co. (FX-604F) through a test pattern with line and space patterns having various line and space widths and a line-to-space width ratio of 1:1, and developed in a 2.38 weight-% aqueous solution of tetramethylammonium hydroxide at 23° C. for 60 seconds. An energy amount enough to resolve a 5-µm line-and-space pattern to 1:1 is determined by observation, which was taken as a sensitivity.

Coating Properties

A radiation sensitive composition to be tested is spin-coated on a chromium layered glass substrate (360 mm×465 mm), and baked on a hot plate at 100° C. for 90 seconds to form a 1.5-µm thick resist layer. Then, thickness of the layer is measured at 600 points of the layer to determine maximum difference in layer thickness (r) and standard deviation (σ). Thus, coating properties (uniformity of layer thickness) are confirmed.

Example 14

Procedures were conducted in the same manner as in Example 13 except for changing the amount of the esterification product between 2,3,4,4'-tetrahydroxybenzophenone and 1,2-naphthoquinonediazide-5-sulfonyl chloride to 20 parts by weight to prepare a radiation sensitive composition. Sensitivity and coating properties of this radiation sensitive composition were measured in the same manner as in Example 13. Results thus obtained are tabulated in Table 3.

Comparative Example 3

Procedures were conducted in the same manner as in Example 13 except for changing the amount of the esterification product between 2,3,4,4'-tetrahydroxybenzophenone and 1,2-naphthoquinonediazide-5-sulfonyl chloride to 25 parts by weight and not adding poly-t-butyl methacrylate to prepare a radiation sensitive composition. Sensitivity and coating properties of this radiation sensitive composition were measured in the same manner as in Example 13. Results thus obtained are shown in Table 3.

TABLE 3

|  | Sensitivity (mJ/cm$^2$) | Coating properties r (Å) | Coating properties σ (Å) |
|---|---|---|---|
| Example 13 | 40 | 355 | 50 |
| Example 14 | 80 | 490 | 80 |
| Comparative Example 3 | 80 | 620 | 100 |

Resist layer-remaining ratios of the radiation sensitive composition of Examples 13 and 14 and Comparative Example 3 were 94.0%, 99.0% and 93.5% respectively. It is seen from the results of Examples 13 and 14 and Comparative Examples 3 that even when the amount of the radiation sensitive material was reduced, the radiation sensitive composition of the present invention had high sensitivity and good resist layer-remaining property, and showed excellent coating properties.

Example 15

100 parts by weight of a mixture of novolak resin having a weight average molecular weight of 6,000 and poly-t-butyl methacrylate (PtBMA) having a weight average molecular weight of 10,000 in mixing ratio of 100:3 and 19 parts by weight of an esterification product between 2,3,4,4'-tetrahydroxyphenone and 1,2-naphthoquinonediazide-5-sulfonyl chloride were dissolved in propylene glycol monomethyl ether acetate and, for preventing formation of radial wrinkles, so-called striation, on a resist layer upon spin coating, 300 ppm of a fluorine-containing surfactant, Fluorad-472 (manufactured by Sumitomo 3M Co.) was added thereto. After stirring the mixture, it was filtered through a 0.2-μm filter to prepare a radiation sensitive composition of the present invention. Sensitivity and coating properties of this radiation sensitive composition were measured in the same manner as in Example 13. Additionally, in this Example, baking temperature upon formation of the resist layer for measuring sensitivity was 95° C., 100° C., or 105° C., and sensitivity was measured with respect to resist layers having been baked at respective temperatures. Results thus obtained are tabulated in Tables 4 and 5.

Example 16

Procedures were conducted in the same manner as in Example 15 except for using novolak resin having a weight average molecular weight of 15,000 to obtain results shown in Tables 4 and 5.

TABLE 4

|  | Novolak resin: PtBMA (ratio by weight) | Molecular weight of novolak resin | Amount of a radiation sensitive material | Sensitivity S (mJ/cm$^2$) | | | ΔS (105 − 95) |
|---|---|---|---|---|---|---|---|
|  |  |  |  | 95° C. | 100° C. | 105° C. |  |
| Example 15 | 100:3 | 6,000 | 19 | 18.5 | 21.2 | 23.4 | 4.9 |
| Example 16 | 100:3 | 15,000 | 19 | 26.3 | 30.3 | 34.0 | 7.7 |

TABLE 5

|  | Coating properties R (Å) | Coating properties σ (Å) |
|---|---|---|
| Example 15 | 350 | 60.0 |
| Example 16 | 570 | 111.0 |

Additionally, resist patterns obtained in Examples 15 and 16 had a good pattern form with no scum.

It is seen from the above Tables 4 and 5 that novolak resin with a smaller molecular weight provides more preferable sensitivity difference ΔS (difference in sensitivity between the sensitivity attained by baking at 105° C. and that at 95° C.) which is resulting from the difference in coating properties and baking conditions, that is, more preferable uniformity in line width of resist pattern which depends upon processing conditions. Additionally, smaller ΔS means that a formed pattern suffers less dimensional change even when there arises difference in temperature due to temperature distribution in the same substrate upon being exposed in a definite exposure amount, that is, the resist layer has an excellent line width uniformity.

Example 17

100 parts by weight of a 100:3 mixture of novolak resin having a weight average molecular weight of 15,000 and polymethyl methacrylate (PMMA) having a weight average molecular weight of 10,000 and 20 parts by weight of an esterification product between 2,3,4,4'-tetrahydroxybenzophenone and 1,2-naphthoquinonediazide-5-sulfonyl chloride were dissolved in propylene glycol monomethyl ether acetate and, for preventing formation of radial wrinkles, so-called striation, on a resist layer upon spin coating, 300 ppm of a fluorine-containing surfactant, Fluorad-472 (manufactured by Sumitomo 3M Co.) was added thereto. After stirring the mixture, it was filtered through a 0.2-μm filter to prepare a radiation sensitive composition of the present invention. Dissolution rate of this composition was calculated according to the foregoing "method of measuring dissolution rate of a radiation sensitive composition". In addition, sensitivity of the radiation sensitive composition was observed according to the method of measuring sensitivity described in example 13 to obtain results shown in Table 6.

Examples 18 to 21 and Comparative Examples 4 to 6 procedure conducted in the same manner as in Example 17 exect for changing the mixing ratio of novolak resin to PMMA and the amount of the radiation sensitive material as shown in Table 6 to obtain the results tabulated in Table 6.

TABLE 6

| | Novolak resin: PMMA (ratio by weight) | Amount of an added radiation sensitive material relative to 100 parts by weight of novolak resin (parts by weight) | Dissolutionrate (Å/min) | Sensitivity (Mj/cm$^2$) |
|---|---|---|---|---|
| Example 17 | 100:3 | 20 | 120 | 35 |
| Example 18 | 100:3 | 15 | 2100 | 25 |
| Example 19 | 100:3 | 10 | 3710 | 24 |
| Example 20 | 100:5 | 5 | 120 | 50 |
| Example 21 | 100:5 | 1 | 1500 | 60 |
| Comparative Example 4 | 100:5 | 0.5 | 2400 | 180 |
| Comparative Example 5 | 100:0 | 1 | 33000 | No pattern formed |
| Comparative Example 6 | 100:0 | 15 | 22800 | No pattern formed |

Examples 22 to 26 and Comparative Example 7

Procedures were conducted in the same manner as in Example 17 except for changing PMMA to poly(methyl methacrylate-co-styrene) [P(MMA-St)] having a weight average molecular weight of about 10,000 and the mixing ratio of P(MMA-St) to novolak resin and the amount of the radiation sensitive material as shown in Table 7 to obtain the results tabulated in Table 7.

TABLE 7

| | Novolak resin: P(MMA-St) (ratio by weight) | Amount of an added radiation sensitive material relative to 100 parts by weight of novolak resin (parts by weight) | Dissolutionrate (Å/min) | Sensitivity (mJ/cm$^2$) |
|---|---|---|---|---|
| Example 22 | 100:3 | 20 | 110 | 32 |
| Example 23 | 100:3 | 15 | 1900 | 23 |
| Example 24 | 100:3 | 10 | 3350 | 22 |
| Example 25 | 100:5 | 5 | 110 | 45 |
| Example 26 | 100:5 | 1 | 1350 | 53 |
| Comparative Example 7 | 100:5 | 0.5 | 2100 | 90 |

It is seen from the above Tables 6 and 7 that practicable sensitivity can be obtained with maintaining high layer-remaining properties by adjusting dissolution rate in a 2.38 weight-% tetramethylammonium hydroxide solution of the radiation sensitive composition to 5000 Å/min or less and using the radiation sensitive material in an amount of 1 part by weight or more per 100 parts by weight of the resin composition. Additionally, resist patterns obtained in Examples 17 to 26 had a good pattern form with no scum.

Example 27

Procedures were conducted in the same manner as in Example 17 except for using 100 parts by weight of a 100:3 mixture of novolak resin having a weight average molecular weight of 6,000 and an acrylic copolymer composed of methyl methacrylate, n-butyl methacrylate and acrylic acid in a monomer ratio of 50:50:1 (weight ratio) and having a weight average molecular in weight of 13,000 and 19 parts by weight of the esterification product between 2,3,4,4'-tetrahydroxy-benzophenone and 1,2-naphthoquinonediazide-5-sulfonyl chloride. The radiation sensitive composition showed a dissolution rate in an alkali solution of 570 Å/min and had a sensitivity of 25 mJ/cm$^2$. Additionally, the obtained resist pattern had a good pattern form with no scum.

Example 28

Procedures were conducted in the same manner as in Example 27 except for using a copolymer composed of methyl methacrylate, n-butyl methacrylate and acrylic acid in a monomer ratio of 70:30:1 (weight ratio) and having a weight average molecular weight of 13,000 as the acrylic copolymer. The radiation sensitive composition showed a dissolution rate in an alkali solution of 590 Å/min and had a sensitivity of 20 mJ/cm$^2$. The obtained resist pattern had a good pattern form with no scum.

Example 29

Procedures were conducted in the same manner as in Example 27 except for using a copolymer composed of methyl methacrylate and n-butyl methacrylate in a monomer ratio of 70:30 (weight ratio) and having a weight average molecular weight of 13,000 as the acrylic copolymer. The radiation sensitive composition showed a dissolution rate in an alkali solution of 550 Å/min and had a sensitivity of 22 mJ/cm$^2$. The obtained resist pattern had a good pattern form with no scum.

The results obtained in Examples 27 to 29 were shown in Table 8.

TABLE 8

| | Novolak resin: acrylic copolymer (ratio by weight) | Amount of an added radiation sensitive material per 100 parts by weight of novolak resin (parts by weight) | Dissolution rate (Å/min) | Sensitivity (mJ/cm$^2$) |
|---|---|---|---|---|
| Example 27 | 100:3 | 19 | 570 | 25 |
| Example 28 | 100:3 | 19 | 590 | 20 |
| Example 29 | 100:3 | 19 | 550 | 22 |

Example 30

100 parts by weight of a mixture of novolak resin having a weight average molecular weight of 6,000 and the polymer described in Synthesis Example 1 in a mixing ratio of 100:3 (by weight) and 19 parts by weight of an esterification product between 2,3,4,4'-tetrahydroxybenzophenone and 1,2-naphthoquinonediazide-5-sulfonyl chloride were dissolved in propylene glycol monomethyl ether acetate and, for preventing formation of radial wrinkles, so-called striation, on a resist layer upon spin coating, 300 ppm of a fluorine-containing surfactant, Fluorad-472 (manufactured by Sumitomo 3M Co.) was added thereto. After stirring the mixture, it was filtered through a 0.2-$\mu$m filter to prepare a radiation sensitive composition of the present invention. Sensitivity and resist layer-remaining ratio of the composition were measured. Additionally, sensitivity was measured in the same manner as in Example 13. Results thus obtained are tabulated in Table 9.

Example 31

Procedures were conducted in the same manner as in Example 30 except for using the polymer described in Synthesis Example 2 in place of the polymer described in Synthesis Example 1 to obtain results tabulated in Table 9.

Example 32

Procedures were conducted in the same manner as in Example 30 except for using the polymer described in Synthesis Example 5 in place of the polymer described in Synthesis Example 1 to obtain results tabulated in Table 9.

Example 33

Procedures were conducted in the same manner as in Example 30 except for using 100 parts by weight of a mixture of novolak resin having a weight average molecular weight of 6,000 and the polymer described in Synthesis Example 2 in a mixing ratio of 100:3 (by weight) and 4 parts by weight of an esterification product between 2,3,4,4'-tetrahydroxybenzophenone and 1,2-naphthoquinonediazide-5-sulfonyl chloride to obtain results tabulated in Table 9.

Example 34

Procedures were conducted in the same manner as in Example 30 except for using the polymer described in Synthesis Example 3 in place of the polymer described in Synthesis Example 1 to obtain results tabulated in Table 9.

Example 35

Procedures were conducted in the same manner as in Example 30 except for using the polymer described in Synthesis Example 4 in place of the polymer described in Synthesis Example 1 to obtain results tabulated in Table 9.

Example 36

Procedures were conducted in the same manner as in Example 30 except for using the polymer described in Synthesis Example 6 in place of the polymer described in Synthesis Example 1 to obtain results tabulated in Table 9.

Comparative Example 8

Procedures were conducted in the same manner as in Example 30 except for not using the polymer described in Synthesis Example 1 to obtain results tabulated in Table 9.

Comparative Example 9

Procedures were conducted in the same manner as in Example 33 except for changing the amount of an added esterification product between 2,3,4,4'-tetrahydroxybenzophenone and 1,2-naphthoquinonediazide-5-sulfonyl chloride relative to 100 parts by weight of novolak resin having a weight average molecular weight of 6,000 to 4 parts by weight and not using the polymer described in Synthesis Example 2 to obtain results tabulated in Table 9.

Comparative Example 10

Procedures were conducted in the same manner as in Example 30 except for using 25 parts by weight of an esterification product between 2,3,4,4'-tetrahydroxybenzophenone and 1,2-naphthoquinonediazide-5-sulfonyl chloride relative to 100 parts by weight of novolak resin having a weight average molecular weight of 10,000 and not using the polymer described in Synthesis Example 1 to obtain results tabulated in Table 9.

TABLE 9

| | Acrylic resin | | | Amount added (phr**) | Amount of added radiation sensitive material (phr**) | Sensitivity (mJ/cm$^2$) | Resist layer-remaining ratio (%) |
|---|---|---|---|---|---|---|---|
| | Copolymerizable components* | Mw | Acid value (mgKOH/g) | | | | |
| Example 30 | MMA, tBuMA, AA | 15,000 | 80 | 300/103 | 19 | 16.8 | 96.0 |
| Example 31 | MMA, tBuMA, AA | 13,000 | 8 | As above | 19 | 17.6 | 97.0 |
| Example 32 | MMA, tBuMA, AA | 13,000 | 1 | As above | 19 | 18.4 | 98.2 |
| Example 33 | MMA, tBuMA, AA | 13,000 | 8 | As above | 4 | 25.3 | 97.0 |
| Example 34 | MMA, nBuMA, AA | 13,000 | 8 | As above | 19 | 16.4 | 97.5 |
| Example 35 | MMA, cHMA, AA | 12,000 | 8 | As above | 19 | 17.8 | 97.3 |
| Example 36 | MMA, tBUMA | 13,000 | 0.3 | As above | 19 | 22.0 | 98.8 |
| Comparative Example 8 | — | — | — | 0 | 19 | No pattern formed | No pattern formed |
| Comparative Example 9 | — | — | — | 0 | 4 | No pattern formed | No pattern formed |
| Comparative Example 10 | — | — | — | 0 | 25 | 35.0 | 97.0 |

*MMA: methyl methacrylate, tBuMA: t-butyl metacrylate. AA: acrylic acid, cHMA: cyclohexyl methacrylate, nBuMA: n-butyl methacrylate
**amount relative to 100 parts by weight of resin in a radiation sensitive composition (parts by weight)

Additionally, resist patterns obtained in Examples 30 to 36 had good line width uniformity and good form with no scum.

However, it is seen from the above Table 9 that, if acid value of the acrylic resin is out of the range of 1 to 80 mg KOH/g, sensitivity is somewhat decreased when the amount of the radiation sensitive material added is 19 parts by weight and that, if acid value of the acrylic resin is in the range of 1 to 80 mg KOH/g, there is obtained a radiation sensitive composition which are good in both sensitivity and resist layer-remaining ratio even when the amount of the radiation sensitive material added is decreased, thus acid value of the acrylic resin being preferably 1 to 80 mg KOH/g. Additionally, if acrylic resins are not used, resist layer-remaining ratio of the radiation sensitive composition is too bad to form patterns.

Example 37

(NMR Measurement of Resin Composition)

$^1$H-NMR spectrum in a heavy acetone solution of a resin composition prepared by mixing novolak resin having a weight average molecular weight of 10,000 and poly-n-butyl methacrylate having a weight average molecular weight of 13,000 in a mixing ratio of 100:3 (by weight) was measured. Integrated value A of area beneath the peaks in a range of 7.2 to 5.6 ppm in the obtained NMR chart and integrated value B of area beneath the peaks in the range of 1.3 to 0.95 ppm excluding area beneath the peak of the solvent of propylene glycol monomethyl ether acetate were calculated, and a value of B/A, that is X, was determined to be 0.042.

Additionally, when NMR spectrum was measured with respect to a sample prepared from a resist film obtained by using a radiation sensitive composition prepared below in place of the above-described resin film, there was obtained the same X value as that obtained with respect to the resin composition.

(Preparation of a Radiation Sensitive Composition)

100 parts by weight of the resin composition described above and 18 parts by weight of an esterification product between 2,3,4,4'-tetrahydroxybenzophenone and 1,2-naphthoquinonediazide-5-sulfonyl chloride were dissolved in propylene glycol monomethyl ether acetate and, for preventing formation of radial wrinkles, so-called striation, on a resist layer upon spin coating, 300 ppm of a fluorine-containing surfactant, Fluorad-472 (manufactured by Sumitomo 3M Co.) was added thereto. After stirring the mixture, it was filtered through a 0.2-$\mu$m filter to prepare a radiation sensitive composition of the present invention.

Sensitivity and resist layer-remaining ratio of the composition were measured. Additionally, sensitivity and coating properties were measured in the same manner as in Example 13. Results thus obtained are tabulated in Table 10.

Example 38

Procedures were conducted in the same manner as in Example 37 except for using poly(methyl methacrylate-co-n-butyl methacrylate) [70:30] having a weight average molecular weight of 13,000 in place of the poly-n-butyl methacrylate to obtain results tabulated in Table 10.

Example 39

Procedures were conducted in the same manner as in Example 37 except for using poly(methyl methacrylate-co-n-butyl methacrylate-co-acrylic acid) [70:29:1] having a weight average molecular weight of 13,000 in place of the poly-n-butyl methacrylate to obtain results tabulated in Table 10.

Example 40

Procedures were conducted in the same manner as in Example 37 except for using a mixture of polymethyl methacrylate having a weight average molecular weight of 13,000 and poly-n-butyl methacrylate in a mixing-ratio of 70:30 in place of the poly-n-butyl methacrylate to obtain results tabulated in Table 10.

Comparative Example 11

$^1$H-NMR spectrum in a heavy acetone solution of novolak resin having a weight average molecular weight of 10,000 was measured. A value of X, or B/A wherein A represents an integrated area beneath the peaks in a range of 7.2 to 5.6 ppm in the obtained NMR chart and B represents an integrated area beneath the peaks in the range of 1.3 to 0.95 ppm was determined to be 0.

100 parts by weight of the above-described resin and 23 parts by weight of the esterification product between 2,3,4,4'-tetrahydroxybenzophenone and 1,2-naphthoquinonediazide-5-sulfonyl chloride were dissolved in propylene glycol monomethyl ether acetate, and subsequent procedures were conducted in the same manner as in Example 37, followed by evaluation of sensitivity, resist layer-remaining ratio and coating properties. Results thus obtained are tabulated in Table 10.

Comparative Example 12

Procedures were conducted in the same manner as in Comparative Example 11 except for changing the amount of the esterification product between 2,3,4,4'-tetrahydroxybenzophenone and 1,2-naphthoquinonediazide-5-sulfonyl chloride to 18 parts by weight. Results thus obtained are tabulated in Table 10.

TABLE 10

| | X = | Sensitivity | Resist layer-remaining ratio | Coating properties | |
|---|---|---|---|---|---|
| | B/A | (mJ/cm$^2$) | (%) | r (Å) | σ (Å) |
| Example 37 | 0.042 | 27 | 96 | 360 | 50 |
| Example 38 | 0.042 | 25 | 96 | 350 | 47 |
| Example 39 | 0.042 | 23 | 96 | 350 | 47 |
| Example 40 | 0.042 | 25 | 96 | 350 | 52 |
| Comparative Example 11 | 0 | 40 | 85 | 620 | 100 |
| Comparative Example 12 | 0 | No pattern formed | 0 | — | — |

Example 41

Procedures were conducted in the same manner as in Example 37 except for changing the mixing ratio of novolak resin and poly-n-butyl methacrylate used in Example 37 to 100:10 by weight and the amount of the esterification product between 2,3,4,4'-tetrahydroxybenzophenone and 1,2-naphtho-quinonediazide-5-sulfonyl chloride to 12 parts by weight. Then sensitivity and resist layer-remaining ratio of the composition were evaluated. Results thus obtained are tabulated in Table 11.

Example 42

Procedures were conducted in the same manner as in Example 41 except for using poly(methyl methacrylate-co-n-butyl methacrylate) [70:30] having a weight average molecular weight of 13,000 in place of poly-n-butyl methacrylate to obtain results tabulated in Table 11.

Example 43

Procedures were conducted in the same manner as in Example 41 except for using poly(methyl methacrylate-co-n-butyl methacrylate-co-acrylic acid) [70:29:1] having a weight average molecular weight of 13,000 in place of poly-n-butyl methacrylate to obtain results tabulated in Table 11.

Example 44

Procedures were conducted in the same manner as in Example 41 except for using a mixture of polymethyl methacrylate having a weight average molecular weight of 13,000 and poly-n-butyl methacrylate in mixing ratio of 70:30 in place of poly-n-butyl methacrylate to obtain results tabulated in Table 11.

Comparative Example 13

Procedures were conducted in the same manner as in Example 41 except for not using poly-n-butyl methacrylate to obtain results tabulated in Table 11.

TABLE 11

|  | X = B/A | Sensitivity (mJ/cm$^2$) | Resist layer-remaining ratio (%) |
| --- | --- | --- | --- |
| Example 41 | 0.12 | 80 | 100 |
| Example 42 | 0.12 | 70 | 100 |
| Example 43 | 0.12 | 60 | 100 |
| Example 44 | 0.12 | 70 | 100 |
| Comparative Example 13 | 0 | No pattern formed | 0 |

Example 45

Procedures were conducted in the same manner as in Example 37 except for changing a mixing ratio of novolak resin and poly-n-butyl methacrylate to 100:0.25 by weight and the amount of the esterification product between 2,3,4,4'-tetrahydroxybenzophenone and 1,2-naphthoquinonediazide-5-sulfonyl chloride to 23 parts by weight to obtain results tabulated in Table 12.

Example 46

Procedures were conducted in the same manner as in Example 45 except for using poly(methyl methacrylate-co-n-butyl methacrylate) [70:30] having a weight average molecular weight of 13,000 in place of poly-n-butyl methacrylate to obtain results tabulated in Table 12.

Example 47

Procedures were conducted in the same manner as in Example 45 except for using poly(methyl methacrylate-co-n-butyl methacrylate-co-acrylic acid) [70:29:1] having a weight average molecular weight of 13,000 in place of poly-n-butyl methacrylate to obtain results tabulated in Table 12.

TABLE 12

|  | X = B/A | Sensitivity (mJ/cm$^2$) | Resist layer-remaining ratio (%) |
| --- | --- | --- | --- |
| Example 45 | 0.012 | 40 | 92 |
| Example 46 | 0.012 | 40 | 92 |
| Example 47 | 0.012 | 40 | 92 |

It is seen from Table 12 that even when the mixed resin is added in a small amount, sensitivity and resist layer-remaining ratio can be improved.

Figure 2:
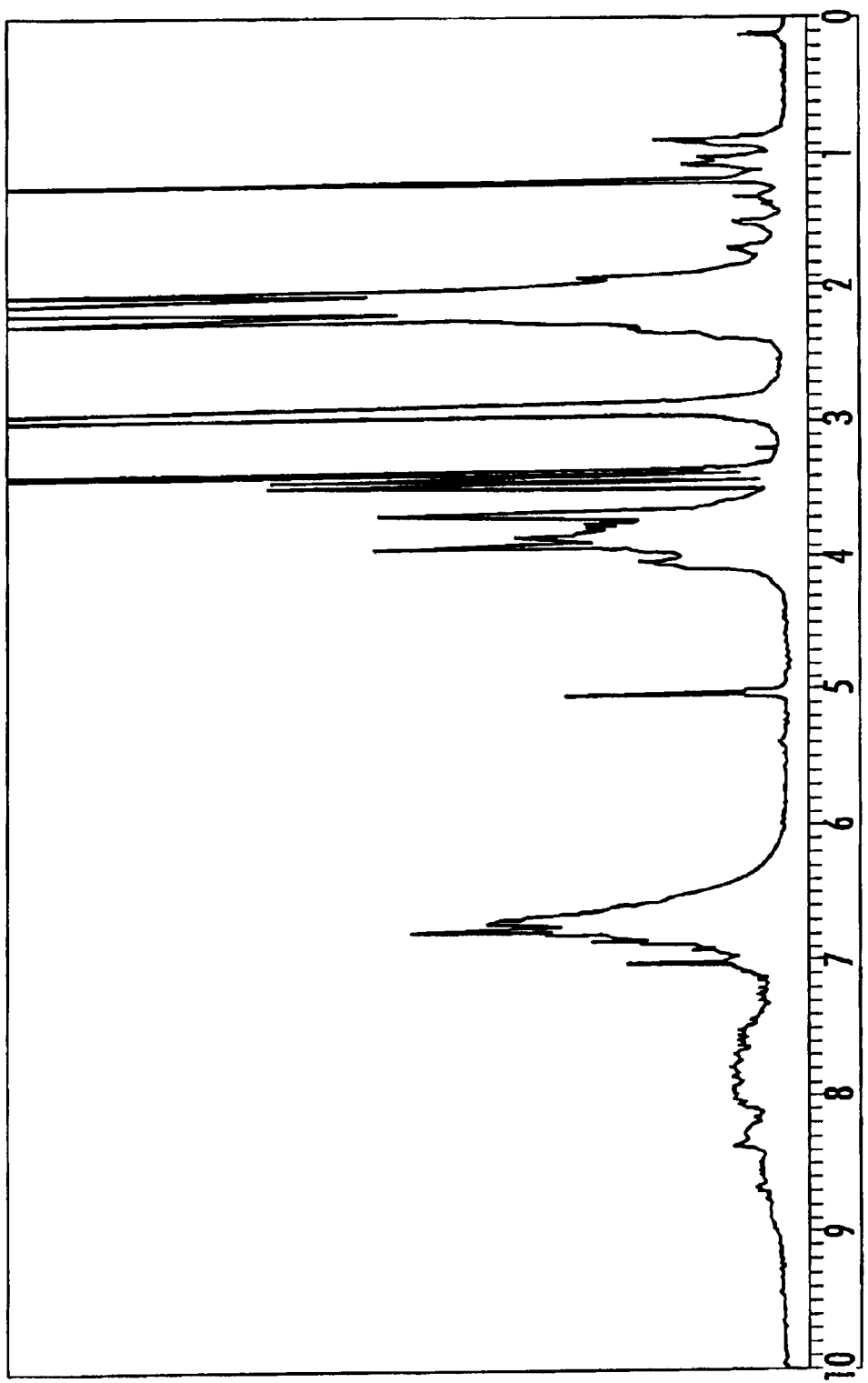
FIG. 2 is a $^1$H-NMR spectrum chart of a radiation sensitive composition obtained by measuring a resist film formed from a radiation sensitive composition prepared using as the resin composition the mixed resin consisting of a novolak resin and an acrylic polymer (100:10) as a sample.

Additionally, a chart obtained by measuring $^1$H-NMR spectrum of a sample film formed by a mixed resin consisting of novolak resin and acrylic polymer (100:10) is shown in FIG. 1, and a chart obtained by measuring $^1$H-NMR spectrum of a resist film sample formed by using a radiation sensitive composition containing this mixed resin is shown in FIG. 2. As is shown in these charts obtained with the mixed resin film sample and the resist film sample, respectively, they are scarcely different from each other in the value of X, or B/A wherein A represents an integrated area beneath the peaks in a range of 7.2 to 5.6 ppm in the obtained NMR chart and B represents an integrated area beneath the peaks in the range of 1.3 to 0.95 ppm excluding integrated area beneath the peak of the solvent of propylene glycol monomethyl ether acetate, though some difference in spectrum is observed based on the difference in components contained in the samples. This is not limited to the resin composition used for obtaining the charts but applies to the resin composition of each of the above-described Examples. Example 37 specifically demonstrates this, but with respect to each of the resin composition used in other Examples, too, the X value obtained with resin film sample and the X value with resist film sample were substantially the same.

Example 48

To 100 parts by weight of novolak resin having a weight average molecular weight of 7,000, 20 parts by weight of an esterification product between 2,3,4,4'-tetrahydroxybenzophenone and 1,2-naphthoquinonediazide-5-sulfonyl chloride and 3.0 parts by weight of polystyrene (PSt) having a weight average molecular weight of 14,000 were dissolved in propylene glycol monomethyl ether acetate and, for preventing formation of radial wrinkles, so-called striation, on a resist layer upon spin coating, 300 ppm of a fluorine-containing surfactant, Fluorad-472 (manufactured by Sumitomo 3M Co.) was added thereto. After stirring the mixture, it was filtered through a 0.2-$\mu$m filter to prepare a radiation sensitive composition of the present invention. This composition was spin-coated on a 4-inch silicon wafer, and baked on a hot plate at 100° C. for 90 seconds to obtain a 1.5-$\mu$m thick resist layer. This resist layer was exposed with various exposure energies by a g-line stepper made by Nikon Co. (FX-604F) through a test pattern with line and space patterns having various line and space widths and a line-to-space width ratio of 1:1, and developed in a 2.38 weight-% aqueous solution of tetramethylammonium hydroxide at 23° C. for 60 seconds. Resist layer-remaining ratio was determined based on the thickness of resist before and after development. In addition, an energy amount enough to resolve a 5-$\mu$m line-and-space pattern to 1:1 is determined by observation, which was taken as a sensitivity. Thus, there was obtained the result shown in Table 13.

Example 49

Procedures were conducted in the same manner as in Example 48 except for using polystyrene (PSt) having a weight average molecular weight of 7,000 in place of polystyrene (PSt) having a weight average molecular weight of 14,000 to obtain results tabulated in Table 13.

Example 50

Procedures were conducted in the same manner as in Example 48 except for using poly(styrene-co-methyl methacrylate) [90:10] (PSt/MMA) having a weight average molecular weight of 7,000 in place of polystyrene (PSt) having a weight average molecular weight of 14,000 to obtain results tabulated in Table 13.

Example 51

Procedures were conducted in the same manner as in Example 48 except for using 5 parts by weight of o-cresol of a low molecular compound having phenolic hydroxyl group or groups, 21.5 parts by weight of an esterification product between 2,3,4,4'-tetrahydroxybenzophenone and 1,2-naphthoquinonediazide-5-sulfonyl chloride and 3.2 parts by weight of polystyrene (PSt) having a weight average molecular weight of 14,000 relative to 100 parts by weight of novolak resin having a weight average molecular weight 7,000, to obtain results tabulated in Table 13.

Comparative Example 14

Procedures were conducted in the same manner as in Example 48 except for not using polystyrene (PSt) having a weight average molecular weight of 14,000 to obtain results tabulated in Table 13.

Example 52

Procedures were conducted in the same manner as in Example 48 except for using polymethyl methacrylate (PMMA) having a weight average molecular weight of 10,000 in place of polystyrene (PSt) having a weight average molecular weight of 14,000 to obtain results tabulated in Table 13.

TABLE 13

| | Resin coupled with novolak resin | Resist layer-remaining ratio (%) | Sensitivity (mJ/cm$^2$) |
| --- | --- | --- | --- |
| Example 48 | PSt | 98.5 | 23.9 |
| Example 49 | PSt | 99.0 | 28.9 |
| Example 50 | PSt/MMA | 99.3 | 32.0 |
| Example 51 | PSt (with a low molecular compound having a phenolic hydroxyl group) | 98.2 | 21.0 |
| Comparative Example 14 | — | 52.0 (No pattern formed) | — |
| Example 52 | PMMA | 98.0 | 35.0 |

Example 53

Procedures were conducted in the same manner as in Example 48 except for changing the amount of the esterification product between 2,3,4,4'-tetrahydroxybenzophenone and 1,2-naphthoquinonediazide-5-sulfonyl chloride to 25 parts by weight to obtain results tabulated in Table 14.

Comparative Example 15

Procedures were conducted in the same manner as in Example 53 except for not using polystyrene (PSt) having a weight average molecular weight of 14,000 to obtain results tabulated in Table 14.

TABLE 14

| | Resin coupled with novolak resin | Resist layer-remaining ratio (%) | Sensitivity (mJ/cm$^2$) |
| --- | --- | --- | --- |
| Example 53 | PSt | 100.0 | 32.0 |
| Comparative Example 15 | — | 92.0 | 32.0 |

Example 54

Procedures were conducted in the same manner as in Example 48 except for using 30 parts by weight of the esterification product between 2,3,4,4'-tetrahydroxybenzophenone and 1,2-naphthoquinonediazide-5-sulfonyl chloride relative to 100 parts by weight of novolak resin having a weight average molecular weight of 5,000 to obtain results tabulated in Table 15.

Comparative Example 16

Procedures were conducted in the same manner as in Example 54 except for not using polystyrene (PSt) having a weight average molecular weight of 14,000 to obtain results tabulated in Table 15.

TABLE 15

| | Resin coupled with novolak resin | Resist layer-remaining ratio (%) | Sensitivity (mJ/cm$^2$) |
| --- | --- | --- | --- |
| Example 54 | PSt | 100.0 | 26.0 |
| Comparative Example 16 | — | 92.0 | 25.0 |

Example 55

Procedures were conducted in the same manner as in Example 48 except for using 10 parts by weight of the esterification product between 2,3,4,4'-tetrahydroxybenzophenone and 1,2-naphthoquinonediazide-5-sulfonyl chloride and 4.0 parts by weight of polystyrene (PSt) having a weight average molecular weight of 14,000 relative to 100 parts by weight of novolak resin having a weight average molecular weight of 10,000 to obtain results tabulated in Table 16.

Comparative Example 17

Procedures were conducted in the same manner as in Example 55 except for not using polystyrene (PSt) having a weight average molecular weight of 14,000 to obtain results tabulated in Table 16.

TABLE 16

| | Resin coupled with novolak resin | Resist layer-remaining ratio (%) | Sensitivity (mJ/cm$^2$) |
|---|---|---|---|
| Example 55 | PSt | 98.5 | 27.0 |
| Comparative Example 17 | — | No pattern formed | — |

Resist patterns obtained according to Examples 48 to 55 had no scum. In addition, the resist patterns had a good pattern form and good uniformity of line width. It is seen from Tables 13 to 16 that even when styrenic resin is used as the resin additive, radiation sensitive compositions are obtained with high sensitivity and good resist layer-remainlng ratio. Additionally, it is seen from table 13 that when PMMA is selected as a resin coupled with novolak resin, sensitivity and resist layer-remaining ratio are improved, and when PSt is used, a radiation sensitive composition having higher sensitivity than that when PMMA being used is obtained. It may be considered that the improvement of sensitivity is attained by following reason. That is, refractive indexes of PMMA and PSt used in the present invention are different from that of novolak resin, therefore sensitivity of the radiation sensitive composition is improved. On the other hand, difference in refractive index of novolak resin and PSt is smaller than that of novolak resin and PMMA. The difference in refractive index of novolak resin and PSt is more suitable than that of novolak resin and PMMA in viewpoint of improvement of sensitivity to improve utilization efficiency of radiation sensitive materials. Further, it is seen from Table 15 that when styrenic resin is used as a resin additive, high sensitivity and good resist layer-remaining ratio of the radiation sensitive composition can be maintained even if much radiation sensitive material are added thereto in the present invention, that is, low process dependency can be attained.

Advantages of the Invention

According to the first present invention, working effects of a radiation sensitive material can be enhanced by using, as resins for the resin composition to be used in the radiation sensitive composition, at least one set of resins different from each other in refractive index (Δn) by 0.03 or more. Thus, it becomes possible to reduce the amount of the radiation sensitive material in the radiation sensitive composition and improve throughput by enhancing sensitivity of the radiation sensitive composition. According to the second present invention, a radiation sensitive composition can be obtained which shows excellent resist layer-remaining ratio even when the amount of radiation sensitive material is reduced with attempting to enhance sensitivity of the radiation sensitive material, by incorporating as the resin additive a resin capable of working as a dissolution inhibitor into a radiation sensitive composition comprising an alkali-soluble resin and a radiation sensitive material containing quinonediazide group or groups. In addition, according to the present invention, there can be manufactured a radiation sensitive composition which has a high resolution, good developability, and excellent pattern-forming properties and, further, a radiation sensitive composition having excellent coating properties, forming a resist pattern with an excellent line width uniformity and showing low process dependency.

As is described above, the present invention enables one to obtain a radiation sensitive composition having a high sensitivity and excellent properties such as excellent developability, resist layer-remaining properties, coating properties and line width uniformity of a resist pattern, with decreasing the amount of radiation sensitive material used. Thus, the present invention enables one to remarkably reduce the cost of manufacturing semiconductor integrated circuits, FPD, circuit bases for thermal head, etc. by improving throughput due to enhancement of sensitivity and by decreasing the amount of radiation sensitive material.

Industrial Utility

As has been described in detail hereinbefore, the radiation sensitive composition of the present invention is favorably used as a photoresist material for use in manufacturing semiconductor integrated circuits such as LSI, manufacturing FPD, and manufacturing circuit bases for thermal head.

What is claimed is:

1. A radiation sensitive composition comprising a resin composition and a radiation sensitive material, wherein the resin composition comprises at least (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polylsopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate or a copolymer therefrom and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom and the radiation sensitive material is (c) a radiation sensitive material containing a quinonediazide group.

2. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrytic ester of a resin additive is one member selected from the group of polymethyl acrylate, polytethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polyenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom, wherein the resin additive is a copolymer obtained from at least two monomers selected from acrylic esters, methacrylic esters and styrene derivatives, and a copolymer obtained from at least one of these monomers and an organic acid monomer having a carboxyl group or a carboxylic anhydride group.

3. The radiation sensitive composition according to claim 2, wherein a copolymer obtained from at least one monomer selected from acrylic esters, methacrylic esters and styrene derivatives and an organic acid monomer having a carboxyl group or a carboxylic anhydride group has an acid value of 1 to 80 mg KOH/g.

4. The radiation sensitive composition according to claim 2, further comprising a polymer-containing 50 mole-% or more of a repeating unit having a carboxyl group or a carboxylic anhydride group.

5. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom, wherein the dissolution rate in 2.38 weight-% aqueous tetramethylammonium hydroxide of the radiation sensitive composition is not more than 5000 Å/min.

6. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polycrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom wherein when the resin containing styrenic monomer-repeating units of less than 50 mole-% of repeating units in the resin is used as the resin additive, the weight average molecular weight of the resin is 7,000 to 20,000 as determnined by polystyrene standards and when the resin containing styrene derivative-repeating units of not less than 50 mole-% of repeating units in the resin is used as the resin additive, the weight average molecular weight of the resin is 3,000 to 25,000 as determined by polystyrene standards.

7. The radiation sensitive composition according to claim 2, wherein the value of X which is B/A is in the range of 0.01 to 0.13 whereupon A is an integrated area beneath peaks in the range of 7.2 to 5.6 ppm and B is an integrated area beneath peaks in the range of 1.3 to 0.95 ppm in a H-NMR spectrum of a solution of the resin composition in heavy acetone.

8. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers relected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom, wherein the weight average molecular weight of the novolak resin is 3,000 to 15,000 as determnined by polystyrene standards.

9. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom wherein when a resin containing styrenic monomer-repeating units of less than 50 mole-% of repeating units in the resin is used as the resin additive, the amount of the radiation sensitive material is 1 to 20 parts by weight relative to 100 parts by weight of the alkali-soluble resin in the radiation sensitive composition and when a resin containing styrenic monomer-repeating units of not less than 50 mole-% of repeating units in the resin is used as the resin additive, the amount of the radiation sensitive material is 10 to 30 parts by weight relative to 100 parts by weight of the alkali-soluble resin in the radiation sensitive composition.

10. The radiation sensitive composition according to claim 9, wherein when the resin containing styrenic monomer-repeating units of less than 50 mole-% of repeating units in the resin is used as the resin additive, the amount of the radiation sensitive material is 1 to 18 parts by weight relative to 100 parts by weight of the alkali-soluble resin in the radiation sensitive composition.

11. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylontrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-butyl methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom wherein when a resin containing styrenic monomer-repeating units of less than 50 mole-% of repeating units in the resin is used as the resin additive, the content of the resin additive 1 to 20 parts by weight relative to 100 parts by weight of novolak resin of the alkali-soluble resin and when a resin containing styrenic monomer-repeating units of not less than 50 mole-% of repeating units in the resin is used as the resin additive, the content of the resin additive is 0.5 to 5 parts by weight relative to 100 parts by weight of novolak resin of the alkali-soluble resin.

12. A radiation sensitive composition comprising a resin composition and a radiation sensitive material, wherein the resin composition comprises two or more kinds of resins of (a) an alkali-soluble novolak resin and (b) a resin additive selected from the group consisting of polyacrylic ester, polymethacrylic ester, polystyrene derivatives, polyvinyl benzoate, polyvinyl phenyl acetate, polyvinyl acetate, polyvinyl chloroacetate, polyacrylonitrile, poly-α-methylacrylonitrile, polyvinyl phthalimide, and copolymers obtained from two or more monomers selected from acrylic ester, methacrylic ester, styrene derivatives, vinyl benzoate, vinyl phenyl acetate, vinyl acetate, vinyl chloroacetate, acrylonitrile, α-methylacrylonitrile, N-vinyl phthalimide, N-vinyl imidazole, N-vinyl carbazole, 2-vinyl quinoline, vinyl cyclohexane, vinyl naphthalene, vinyl pyridine and N-vinyl pyrrolidone, wherein polyacrylic ester of a resin additive is one member selected from the group of polymethyl acrylate, polyethyl acrylate, poly-n-propyl acrylate, poly-n-butyl acrylate, poly-n-hexyl acrylate, polyisopropyl acrylate, polyisobutyl acrylate, poly-t-butyl acrylate, polycyclohexyl acrylate, polybenzyl acrylate, poly-2-chloroethyl acrylate, polymethyl-α-chloroacrylate, polyphenyl α-bromoacrylate or a copolymer therefrom, and polymethacrylic ester of a resin additive is one member selected from the group of polymethyl methacrylate, polyethyl methacrylate, poly-n-propyl methacrylate, poly-n-buty, methacrylate, poly-n-hexyl methacrylate, polyisopropyl methacrylate, polyisobutyl methacrylate, poly-t-butyl methacrylate, polycyclohexyl methacrylate, polybenzyl methacrylate, polyphenyl methacrylate, poly-1-phenylethyl methacrylate, poly-2-phenylethyl methacrylate, polyfurfuryl methacrylate, polydiphenylmethyl methacrylate, polypentachlorophenyl methacrylate, polynaphthyl methacrylate or a copolymer therefrom further comprising a low molecular compound having phenolic hydroxyl group or groups represented by the general formula (I):

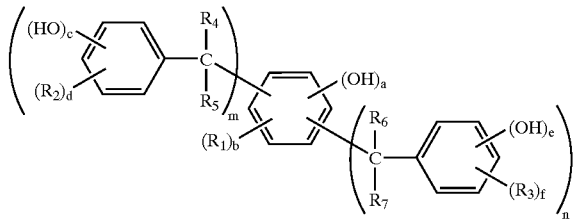

(I)

wherein $R_1$, $R_2$, $R_3$, $R_4$, $R_5$, $R_6$ and $R_7$ each represents independently H, a $C_1$ to $C_4$ alkyl group, a $C_1$ to $C_4$ alkoxyl group, a cyclohexyl group or a group represented by the formula:

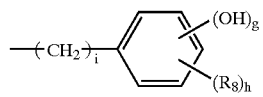

wherein $R_8$ represents H, a $C_1$ to $C_4$ alkyl group, a $C_1$ to $C_4$ alkoxyl group or a cyclohexyl group; each of m and n is 0, 1 or 2; each of a, b, c, d, e, f, g and h is 0 or an integer of 1 to 5 satisfying $a+b \leq 5$, $c+d \leq 5$, $e+f \leq 5$, and $g+h \leq 5$; and i is 0, 1 or 2.

13. The radiation sensitive composition according to claim 1, wherein the resin additive is a copolymer obtained from at least two monomers selected from acrylic esters, methacrylic esters and styrene derivatives, and a copolymer obtained from at least one of these monomers and an organic acid monomer having a carboxyl group or a carboxylic anhydride group.

14. The radiation sensitive composition according to claim 13, wherein a copolymer obtained from at least one monomer selected from acrylic esters, methacrylic esters and styrene derivatives and an organic acid monomer having a carboxyl group or a carboxylic anhydride group has an acid value of 1 to 80 mg KOH/g.

15. The radiation sensitive composition according to claim 13, further comprising a polymer-containing 50 mole-% or more of a repeating unit having a carboxyl group or a carboxylic anhydride group.

16. The radiation sensitive composition according to claim 1, wherein the dissolution rate in 2.38 weight-% aqueous tetramethylammonium hydroxide of the radiation sensitive composition is not more than 5000 Å/min.

17. The radiation sensitive composition according to claim 1, wherein when the resin containing styrenic monomer-repeating units of less than 50 mole-% of repeating units in the resin is used as the resin additive, the weight average molecular weight of the resin is 7,000 to 20,000 as determined by polystyrene standards and when the resin containing styrene derivative-repeating units of not less than 50 mole-% of repeating units in the resin is used as the resin additive, the weight average molecular weight of the resin is 3,000 to 25,000 as determined by polystyrene standards.

18. The radiation sensitive composition according to claim 13, wherein the value of X which is B/A is in the range of 0.01 to 0.13 whereupon A is an integrated area beneath peaks in the range of 7.2 to 5.6 ppm and B is an integrated area beneath peaks in the range of 1.3 to 0.95 ppm in a $^1$H-NMR spectrum of a solution of the resin composition in heavy acetone.

19. The radiation sensitive composition according to claim 1, wherein the weight average molecular weight of the novolak resin is 3,000 to 15,000 as determined by polystyrene standards.

20. The radiation sensitive composition according to claim 1, wherein when a resin containing styrenic monomer-repeating units of less than 50 mole-% of repeating units in the resin is used as the resin additive, the amount of the radiation sensitive material is 1 to 20 parts by weight relative to 100 parts by weight of the alkali-soluble resin in the radiation sensitive composition and when a resin containing styrenic monomer-repeating units of not less than 50 mole-% of repeating units in the resin is used as the resin additive, the amount of the radiation sensitive material is 10 to 30 parts by weight relative to 100 parts by weight of the alkali-soluble resin in the radiation sensitive composition.

21. The radiation sensitive composition according to claim 20, wherein when the resin containing styrenic monomer-repeating units of less than 50 mole-% of repeating units in the resin is used as the resin additive, the amount of the radiation sensitive material is 1 to 18 parts by weight relative to 100 parts by weight of the alkali-soluble resin in the radiation sensitive composition.

22. The radiation sensitive composition according to claim 1, wherein when a resin containing styrenic monomer-repeating units of less than 50 mole-% of repeating units in the resin is used as the resin additive, the content of the resin additive is 1 to 20 parts by weight relative to 100 parts by weight of novolak resin of the alkali-soluble resin and when a resin containing styrenic monomer-repeating units of not less than 50 mole-% of repeating units in the resin is used as the resin additive, the content of the resin additive is 0.5 to 5 parts by weight relative to 100 parts by weight of novolak resin of the alkali-soluble resin.

23. The radiation sensitive composition according to claim 1, further comprising a low molecular compound having phenolic hydroxyl group or groups represented by the general formula (I):

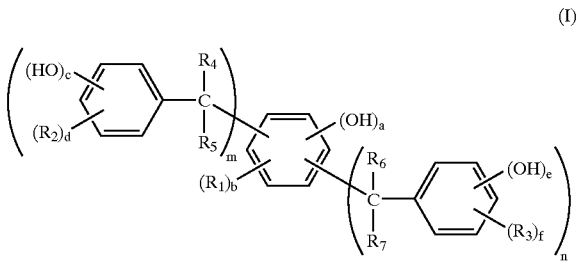

(I)

wherein $R_1$, $R_2$, $R_3$, $R_4$, $R_5$, $R_6$ and $R_7$ each represents independently H, a $C_1$ to $C_4$ alkyl group, a $C_1$ to $C_4$ alkoxyl group, a cyclohexyl group or a group represented by the formula:

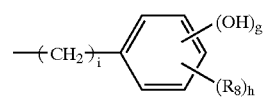

wherein $R_8$ represents H, a $C_1$ to $C_4$ alkyl group, a $C_1$ to $C_4$ alkoxyl group or a cyclohexyl group; each of m and n is 0, 1 or 2; each of a, b, c, d, e, f, g and h is 0 or an integer of 1 to 5 satisfying $a+b \leq 5$, $c+d \leq 5$, $e+f \leq 5$, and $g+h \leq 5$; and i is 0, 1or 2.

* * * * *